(12) United States Patent
Shimizu et al.

(10) Patent No.: US 8,390,001 B2
(45) Date of Patent: Mar. 5, 2013

(54) ELECTRONIC CIRCUIT DEVICE

(75) Inventors: Haruka Shimizu, Kodaira (JP); Natsuki Yokoyama, Mitaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/042,528

(22) Filed: Mar. 8, 2011

(65) Prior Publication Data

US 2011/0220916 A1 Sep. 15, 2011

(30) Foreign Application Priority Data

Mar. 12, 2010 (JP) ................................ 2010-055410

(51) Int. Cl.
*H01L 29/24* (2006.01)

(52) U.S. Cl. .......... 257/77; 257/213; 257/327; 257/328; 257/E29.104; 257/E29.242; 257/76

(58) Field of Classification Search .................... 257/77, 257/76, 213, 327, 328, E29.104, E29.242
See application file for complete search history.

(56) References Cited

U.S. PATENT DOCUMENTS

| 4,115,740 | A | * | 9/1978 | Yoshida et al. | ............... 330/264 |
| 2005/0218424 | A1 | | 10/2005 | Onose et al. | |
| 2009/0014719 | A1 | | 1/2009 | Shimizu et al. | |

FOREIGN PATENT DOCUMENTS

| JP | 2004-134547 A | 4/2004 |
| JP | 2009-21461 A | 1/2009 |

* cited by examiner

*Primary Examiner* — Long Pham
(74) *Attorney, Agent, or Firm* — Mattingly & Malur, PC

(57) ABSTRACT

A normally-off type silicon carbide junction FET has a problem that the gate thereof is not easy to use due to inferiority in the characteristics of it. This problem occurs because in order to achieve normally-off, the gate voltage should be off at 0V and at the same time, the ON-state gate voltage should be suppressed to about 2.5V to prevent the passage of an electric current through a pn junction between gate and source. Accordingly, a range from the threshold voltage to the ON-state gate voltage is only from about 1 V to 2V and it is difficult to control the gate voltage. Provided in the present invention is an electronic circuit device obtained by coupling, to a gate of a normally-off type silicon carbide junction FET, an element having a capacitance equal to or a little smaller than the gate capacitance of the junction FET.

4 Claims, 22 Drawing Sheets

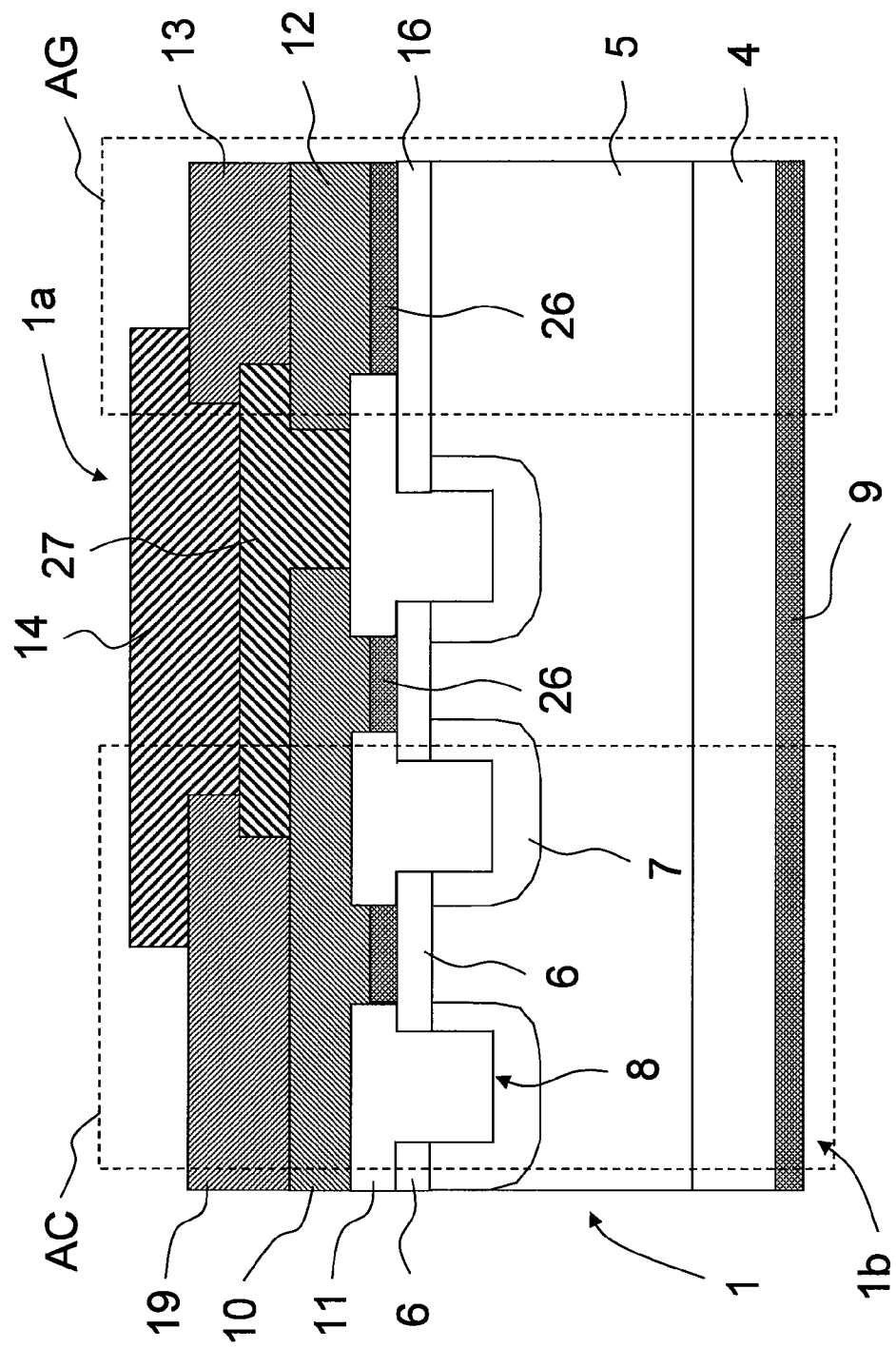

ELECTRONIC CIRCUIT DEVICE

CROSS-REFERENCE TO RELATED APPLICATIONS

The present application claims priority from Japanese patent application JP 2010-055410 filed on Mar. 12, 2010, the content of which is hereby incorporated by reference into this application.

BACKGROUND

The present invention relates to a switching device using silicon carbide as a base material and a gate drive circuit for the switching device.

Japanese Patent Laid-Open No. 2004-134547 (Patent Document 1) or U.S. Patent Laid-Open No. 2005-218424 (Patent Document 2) corresponding thereto discloses an example of a normally-off type silicon carbide junction FET.

Japanese Patent Laid-Open No. 2009-21461 (Patent Document 3) or U.S. Patent Laid-Open No. 2009-14719 (Patent Document 4) corresponding thereto discloses an example of a silicon carbide junction FET having a gate coupled to forward and backward diodes.

Patent Documents

[Patent Document 1] Japanese Patent Laid-Open No. 2004-134547

[Patent Document 2] U.S. Patent Laid-Open No. 2005-218424

[Patent Document 3] Japanese Patent Laid-Open No. 2009-21461

[Patent Document 4] U.S. Patent Laid-Open No. 2009-14719

SUMMARY

In general, semiconductor elements for high power applications of several watts or greater are called "power semiconductor elements". In the power semiconductor elements, on resistance and breakdown voltage are in a trade-off relationship defined by a band gap of a substrate material. It is therefore effective to use a substrate material having a band gap greater than that of silicon in order to exceed the performance of a silicon (Si) element widely used as the power semiconductor element. In particular, silicon carbide (SiC) has attracted a lot of attention because it can realize a high performance semiconductor element such as MISFET (metal insulator semiconductor field effect transistor) by making use of its characteristics that it has a band gap about three times as much as that of silicon, it facilitates formation of both p type and n type conductivities, and it can form an oxide film through thermal oxidation.

An oxide film formed over a silicon carbide substrate has a significant problem, that is, remaining of carbon in the oxide film when silicon carbide is thermally oxidized inevitably forms a high-density interface level. This causes considerable deterioration in channel mobility and a marked increase in the on resistance of the MISFET. In addition, carbon in the oxide film also causes deterioration in reliability of the oxide film and becomes a huge barrier against realizing the MISFET.

A junction FET (field effect transistor) is a semiconductor element having a structure designed to avoid the problem of the interface of the oxide film. The junction FET is an element that uses a pn junction as a gate to control a channel and it is usually a normally-on type element which is not turned OFF without applying a negative voltage to the gate as in the case of an element formed using silicon as a base material. In general, normally-off type power semiconductor elements are desired because normally-on type ones are limited in their use in view of fail safe.

The normally-off type junction FET made of silicon cannot have a high breakdown voltage, but a normally-off type junction FET made of silicon carbide can have a high breakdown voltage by narrowing its channel width. The reason is because since the diffusion potential of the pn junction of silicon carbide is as high as about 2.5V, the channel can be turned OFF without applying a negative voltage to the gate.

Such a junction FET using silicon carbide as a base material enables to realize a high-performance normally-off type element not susceptible to the interface of an oxide film.

Normally-off type silicon carbide junction FET is considerably different from the conventional MOSFET in the characteristics of the gate so that it is not easy to use. This is because in order to realize a normally-off type FET, it is off-state at a gate voltage of 0V and at the same time, the ON-state gate voltage should be suppressed to about 2.5V to prevent passage of an electric current through a pn junction between gate and source. As a result, the gate voltage should be controlled substantially within a range of from 0V to 2.5V. This includes two problems. The first one is necessity of designing the element to have a threshold voltage of from about 0.5V to 1.5V in order to realize low ON resistance, which however includes the possibility of malfunction in the presence of noise. The second one is that a difference between the threshold voltage and the ON-state gate voltage is only from about 1V to 2V and a drain current is very sensitive to changes in gate voltage, making it difficult to control the gate.

Japanese Patent Laid-Open No. 2009-21461 (Patent Document 3) proposes, as means for overcoming the former problem, a structure of coupling a forward diode and a backward diode to a gate. In this structure, the diodes are responsible for the voltage applied to external terminals of the gate so that the threshold voltage of the junction FET increases only by an apparent diffusion potential of the diodes. On the other hand, it is very difficult to improve the dependence of the drain current on the gate voltage in consideration of the structure of the element.

As described above, a normally-off type silicon carbide junction FET has a problem that because of high sensitivity of a drain current to changes in gate voltage, highly precise control of the gate is necessary.

The present invention has been made with a view to overcoming these problems.

An object of the invention is to provide a silicon carbide semiconductor device easy to use and a manufacturing method of the device.

The above-described and the other objects and novel features of the invention will be apparent from the description herein and accompanying drawings.

Typical inventions, among inventions disclosed herein, will be briefly outlined as follows.

One of the most principal features of the invention according to the present application is that to a gate of a normally-off type silicon carbide junction FET are coupled an element having a capacitance comparable to a gate capacitance of the junction FET and a diode, which is in the direction of the gate of the junction FET, in parallel to each other.

Advantages available by the typical inventions, among inventions disclosed herein, will be briefly described as follows.

In short, in the invention, a voltage applied to the external terminal of a gate is shared by a capacitive component coupled to a gate electrode and a gate capacitance of a junction FET, making it possible to apparently decrease the gate voltage dependence of a drain current, thereby facilitating the control of the gate of the junction FET.

BRIEF DESCRIPTION OF THE DRAWINGS

FIG. 30 is a schematic device cross-sectional view taken along a line X-X' of FIG. 29.

DETAILED DESCRIPTION

Summary of the Embodiments

Figure 1:
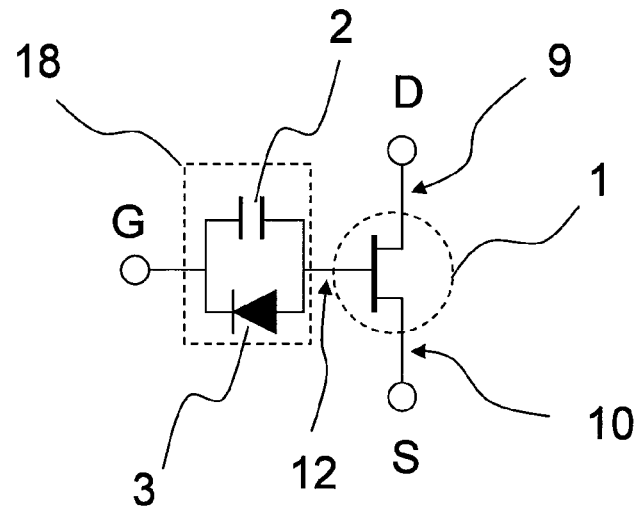
FIG. 1 is a circuit diagram of a first embodiment of the semiconductor device according to the invention.

First, typical embodiments of the invention disclosed herein are summarized.

1. An electronic circuit device includes: (a) a silicon carbide-based normally-off type junction FET having a gate electrode, a source electrode, and a drain electrode; and (b) an element or an element group inserted between the gate electrode of the normally-off type junction FET and a gate drive circuit. In the electronic circuit device, the element or the element group in which elements have been coupled in parallel to each other includes a capacitor or a diode, which is in a direction contrary to the gate electrode, but does not include the other parallel-coupled elements.

2. In the electronic circuit device as described above in 1, the element or the element group includes a capacitor and the diode.

3. In the electronic circuit device as described above in 1 or 2, when a voltage applied to the element or the element group is 12.5 V, a capacitance of the element or the element group is from 1/3 to 1/7 of a gate capacitance at the time when the gate voltage of the junction FET is 2.5 V.

4. The electronic circuit device as described above in 1 or 3, further includes: (c) a package having the junction FET and the capacitor or the diode housed therein and having first, second, and third pins; (d) a first solder layer configuring a current path between the first pin and a drain electrode of the junction FET; (e) a second solder layer configuring a current path between the second pin and a cathode electrode of the diode or one of electrodes of the capacitor; (f) a first bonding wire configuring a current path between the gate electrode of the junction FET and an anode electrode of the diode or the other electrode of the capacitor; and (g) a second bonding wire configuring a current path between the third pin and the source electrode of the junction FET.

5. The electronic circuit device as described above in 2 or 3, further includes: (c) a package having the junction FET, the capacitor, and the diode housed therein and having first, second and third pins; (d) a first solder layer configuring a current path between the first pin and a drain electrode of the junction FET; (e) a second solder layer configuring a current path among the second pin, a cathode electrode of the diode, and one of electrodes of the capacitor; (f) a first bonding wire configuring a current path among the gate electrode of the junction FET, an anode electrode of the diode, and the other electrode of the capacitor; and (g) a second bonding wire configuring a current path between the third pin and the source electrode of the junction FET.

6. In the electronic circuit device as described above in any of 1 to 3, the junction FET has been formed in a semiconductor chip, and the semiconductor chip includes: (x1) a gate electrode of the junction FET; (x2) a gate pad of the junction FET; and (x3) an insulating film configuring, between the gate electrode and the gate pad, a capacitor together with them.

7. In the electronic circuit device as described above in any of 1 to 3 and 6, the junction FET has been formed in a semiconductor chip, and the semiconductor chip includes: (x1) a gate electrode of the junction FET; (x2) a gate pad of the junction FET; and (x4) a P type semiconductor region, a first N type semiconductor region, and a second N type semiconductor region having a concentration higher than that of the first N type semiconductor region, which regions have been provided successively in order of mention between the gate electrode and the gate pad so as to configure, as the diode, a PIN diode together therewith.

8. In the electronic circuit device as described above in any of 1 to 3, and 6, the junction FET has been formed in a semiconductor chip, and the semiconductor chip includes: (x1) a gate electrode of the junction FET; (x2) a gate pad of the junction FET; (x3) an insulating film configuring, between the gate electrode and the gate pad, the capacitor together with them; and (x4) a P type semiconductor region, a first N type semiconductor region, and a second N type semiconductor region having a concentration higher than that of the first N type semiconductor region, which regions have been provided successively in order of mention between the gate electrode and the gate pad so as to configure, as the diode, a PIN diode together therewith.

9. In the electronic circuit device as described above in any of 1 to 3 and 6, the junction FET has been formed in a semiconductor chip, and the semiconductor chip includes: (x1) a gate electrode of the junction FET; (x2) a gate pad of the junction FET; and (x4) a Schottky junction portion configuring, between the gate electrode and the gate pad, the diode together therewith.

10. In the electronic circuit device as described above in any of 1 to 3 and 6, the junction FET has been formed in a semiconductor chip, and the semiconductor chip includes: (x1) a gate electrode of the junction FET; (x2) a gate pad of the junction FET; (x3) an insulating film configuring, between the gate electrode and the gate pad, a capacitor together therewith; and (x4) a Schottky junction portion configuring, between the gate electrode and the gate pad, the diode together therewith.

11. An electronic circuit device, includes: (a) a silicon carbide-based normally-off type junction FET having a gate electrode, a source electrode, and a drain electrode; and (b) an element having a capacitive component or an element group having elements coupled in parallel to each other and having a capacitive component as an entirety of the group, the element or element group being inserted between the gate electrode of the normally-off type junction FET and a gate drive circuit. In the electronic device, the capacitive component has a capacitance of an equal level to or an equal level to but smaller than a gate capacitance of the junction FET and further, has substantially no voltage dependence or has negative voltage dependence.

12. In the electronic circuit device as described above in 11, when a voltage applied to the element or the element group having a capacitive component is 12.5V, a capacitance of the element or the element group is from ⅓ to ⅐ of a gate capacitance at the time when a gate voltage of the junction FET is 2.5V.

13. In the electronic circuit device as described above in 11 or 12, the element is a capacitor or a diode which is in a direction contrary to the gate electrode.

14. In the electronic circuit device as described above in 11 or 12, the element group has a capacitor and a diode which is in a direction contrary to the gate electrode.

15. In the electronic circuit device as described above in any of 11 to 14, the element or the element group does not have an element other than the capacitor and the diode.

16. The electronic circuit device as described above in any of 11 to 15, further includes: (c) a package having the junction FET and either the capacitor or the diode housed therein and having first, second, and third pins; (d) a first solder layer configuring a current path between the first pin and a drain electrode of the junction FET; (e) a second solder layer configuring a current path between the second pin and a cathode electrode of the diode or one of electrodes of the capacitor; (f) a first bonding wire configuring a current path between the gate electrode of the junction FET and an anode electrode of the diode or the other electrode of the capacitor; and (g) a second bonding wire configuring a current path between the third pin and the source electrode of the junction FET.

17. The electronic circuit device as described above in any of 11 to 15, further includes: (c) a package having the junction FET, the capacitor, and the diode housed therein and having first, second, and third pins; (d) a first solder layer configuring a current path between the first pin and a drain electrode of the junction FET; (e) a second solder layer configuring a current path among the second pin, a cathode electrode of the diode, and one of electrodes of the capacitor; (f) a first bonding wire configuring a current path among the gate electrode of the junction FET, an anode electrode of the diode, and the other electrode of the capacitor; and (g) a second bonding wire configuring a current path between the third pin and the source electrode of the junction FET.

18. In the electronic circuit device as described above in any of 11 to 15 and 18, the junction FET is formed in a semiconductor chip, and the semiconductor chip includes: (x1) a gate electrode of the junction FET; (x2) a gate pad of the junction FET; and (x3) an insulating film configuring, between the gate electrode and the gate pad, the capacitor together therewith.

19. In the electronic circuit device as described above in any of 11 to 15 and 18, the junction FET is formed in a semiconductor chip, and the semiconductor chip includes: (x1) a gate electrode of the junction FET; (x2) a gate pad of the junction FET; and (x4) a P type semiconductor region, a first N type semiconductor region, and a second N type semiconductor region having a concentration higher than that of the first N type semiconductor region, which regions have been provided successively in order of mention between the gate electrode and the gate pad so as to configure, as the diode, a PIN diode together therewith.

20. In the electronic circuit device as described above in any of 11 to 15 and 18, the junction FET is formed in a semiconductor chip, and the semiconductor chip includes: (x1) a gate electrode of the junction FET; (x2) a gate pad of the junction FET; (x3) an insulating film configuring, between the gate electrode and the gate pad, the capacitor together therewith; and (x4) a P type semiconductor region, a first N type semiconductor region, and a second N type semiconductor region having a concentration higher than that of the first N type semiconductor region, which regions have been provided successively in order of mention between the gate electrode and the gate pad so as to configure, as the diode, a PIN diode together therewith.

21. In the electronic circuit device as described above in any of 11 to 15 and 18, the junction FET is formed in a semiconductor chip, and the semiconductor chip includes: (x1) a gate electrode of the junction FET; (x2) a gate pad of the junction FET; and (x4) a Schottky junction portion configuring, between the gate electrode and the gate pad, the diode together therewith.

22. In the electronic circuit device as described above in any of 11 to 15 and 18, wherein the junction FET is formed in a semiconductor chip, and the semiconductor chip includes: (x1) a gate electrode of the junction FET; (x2) a gate pad of the junction FET; (x3) an insulating film configuring, between the gate electrode and the gate pad, the condenser together therewith; and (x4) a Schottky junction portion configuring, between the gate electrode and the gate pad, the diode together therewith.

Explanation of Description Manner, Basic Terms, and Usage in the Present Application 1. In the present application, a description in embodiments may be made after divided in a plurality of sections if necessary for convenience's sake. These plural sections are not independent each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituents, they are not essential unless otherwise specifically indicated, limited to the number theoretically, or principally apparent from the context that it is not.

In the present application, the term "semiconductor chip", "semiconductor device", or "semiconductor integrated circuit device" mainly means a single transistor (active element) or a semiconductor chip or the like (using, as a semiconductor chip material, for example, a single crystal SiC substrate, a single crystal silicon substrate, a composite substrate of them, or a crystal polymorphism of SiC, mainly 4H—SiC, instead of which another crystal polymorphism is of course usable) over which a resistor, a capacitor, a diode, and the like have been integrated with the transistor as a main element.

In the present application, the term "electronic circuit device" means a semiconductor chip, a semiconductor device, a semiconductor integrated circuit device, a resistor, a capacitor, a diode or the like, or an interconnected system thereof.

Typical examples of various transistors include junction FET (field effect transistor).

In many of recently-developed high-power electronic circuit devices, semiconductor devices, and semiconductor integrated circuit devices, metal electrodes of their source and gate are comprised of a single aluminum-based (or refractory metal-based such as tungsten-based) M1 interconnect layer or comprised of two layers, that is, an aluminum-based (or refractory metal-based such as tungsten-based) M1 interconnect layer and M2 interconnect layer. A copper-based interconnect layer may also be used as these interconnect layers.

2. Similarly, with regard to any material, any composition or the like in the description of embodiments, the term "X made of A" or the like does not exclude X having, as a main constituent component thereof, an element other than A unless otherwise specifically indicated or principally apparent from the context it is not. For example, the term "X made of A" means that "X has, as a main component thereof, A". It is needless to say that, for example, the term "silicon member" or "SiC (silicon carbide) member" is not limited to a member made of pure silicon or SiC but also a member containing a multi-element semiconductor having as a main component thereof silicon or SiC and in addition, an additive, and the like. Similarly, it is needless to say that the term "silicon oxide film" or "silicon oxide-based insulating film" means not only a relatively pure undoped silicon dioxide film but also a FSG (fluorosilicate glass) film, a TEOS-based silicone oxide film, a SiOC (silicon oxycarbide) film, a carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by method of application such as SOG (spin on glass) and NSC (nano-clustering silica) films, silica-based low-k insulating films (porous insulating films) obtained by introducing pores into similar members thereto, and composite films of the above-exemplified film, which is a main constituent, with another silicon-based insulating film.

A silicon-based insulating film ordinarily used in the semiconductor field as well as a silicon oxide-based insulating film is a silicon nitride-based insulating film. Examples of materials of such insulating films include SiN, SiCN, SiNH, and SiCNH. The term "silicon nitride" means both SiN and SiNH unless otherwise specifically indicated that it is not. Similarly, the term "SiCN" means both SiCN and SiCNH unless otherwise specifically indicated that it is not.

Incidentally, SiC has properties analogous to those of SiN. On the other hand, SiON should be, in most cases, classified as a silicon oxide-based insulating film.

Similarly, in the present application, the term "nickel silicide" usually means $N_2Si$ but it means not only relatively pure nickel silicide but also an alloy, mixed crystal, and the like having $N_2Si$ as a main constituent. The term "silicide" does not only mean nickel silicide but also another silicide or the like which has been proven conventionally. As a metal film for silicidation, not only an Ni (nickel) film but also a nickel alloy film, for example, Ni—Pt alloy film (alloy film of Ni and Pt), Ni—V alloy film (alloy film of Ni and V), Ni—Pd alloy film (alloy film of Ni and Pd), Ni—Yb alloy film (alloy film of Ni and Yb), or Ni—Er alloy film (alloy film of Ni and Er) is usable. Silicides having nickel as a main metal element are collectively called "nickel-based silicides".

3. Similarly, preferred examples of the shape, position, attribute and the like will be shown, however, it is needless to say that they are not strictly limited to the preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a silicon carbide single crystal wafer, single crystal silicon wafer, or the like over which a semiconductor integrated circuit device (which also means a semiconductor device or an electronic device) is to be formed. It is however needless to say that it embraces a composite wafer of an insulating substrate with a semiconductor layer such as epitaxial wafer or LCD glass substrate.

Further Details Description of the Embodiments

Embodiments will be described in further detail. In all the drawings, the same or like members will be identified by the same or like symbols or reference numerals and overlapping descriptions will be omitted in principle.

Moreover, when in the accompanying drawings, hatching or the like complicates the drawing or a difference from a space portion is clear, hatching is sometimes omitted even from a cross-sectional view. In this connection, even when it is apparent from the description or the like that a hole is clearly closed in a planar view, a contour of the background is sometimes omitted. Further, hatching may be applied even if it is not a cross-sectional view to clearly show that it is not a space portion.

1. Description of a Semiconductor Device and the Like of a First Embodiment of the Present Application (Mainly, from FIG. 1 to FIG. 9)

In this section, only an essential part of a normally-off type silicon carbide-based junction FET (1) is illustrated to mainly make a fundamental description. A peripheral structure and a manufacturing method of it will be described in Sections 7 and 8.

Figure 2:
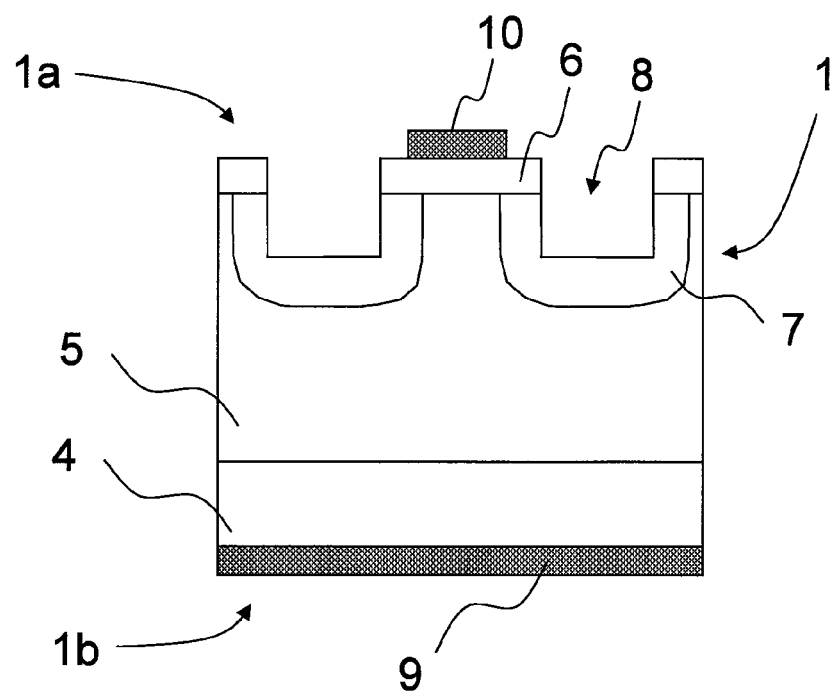
FIG. 2 is a cross-sectional structural view of a silicon carbide junction FET used in the embodiment of the semiconductor device according to the invention.
Figure 3:
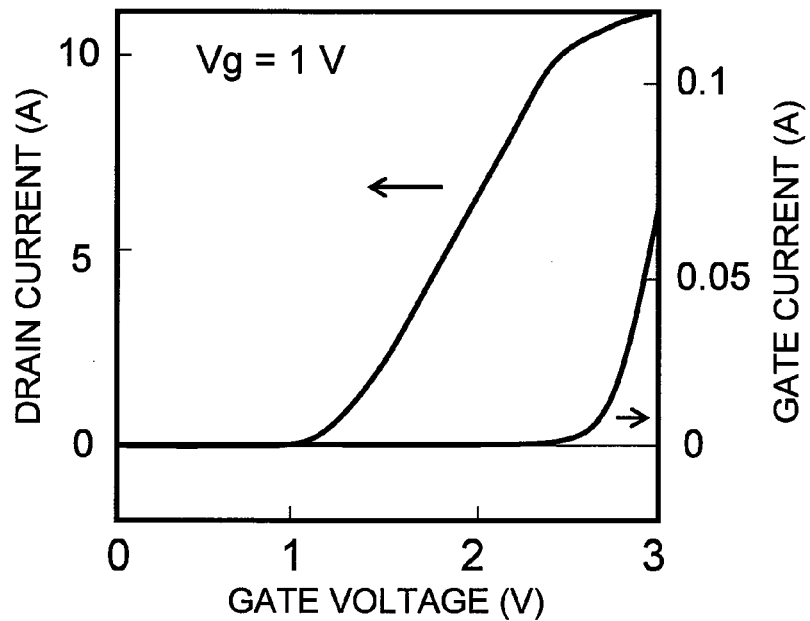
FIG. 3 is a characteristic diagram of the silicon carbide junction FET used in the embodiment of the semiconductor device according to the invention.

The first embodiment of the invention will hereinafter be described referring to some drawings. FIG. 1 is an equivalent circuit diagram of the first embodiment of the invention; and FIGS. 2 and 3 are a cross-sectional structural view of a silicon carbide junction FET to be used in the present embodiment and a characteristic diagram of a gate. As illustrated in FIG. 1, no additional element is inserted between an external source terminal S of the silicon carbide-based junction FET (1) and a source electrode 10 and an external drain terminal D and a drain electrode 9. As an insertion element or element group (element or element group 18), a capacitor and a diode coupled in parallel to each other are however inserted between the external gate terminal G and the gate electrode 12. The insertion element or insertion element group 18 basically does not contain parallel elements other than them.

The present embodiment is, as illustrated in FIGS. 1 and 2, made of a junction FET 1 having silicon carbide as a base material, a capacitor 2, and a pn diode 3 having silicon as a base material. The capacitor 2 and the pn diode 3 are coupled in parallel to a gate of the junction FET 1. The junction FET 1 is comprised of an n$^+$ layer 6 (surface 1$a$ of an SiC semiconductor chip 1) in a source region, an n$^-$ layer 5 in a drift region, an n$^+$ substrate 4 (surface 1$b$ of the SiC semiconductor chip 1) in a drain region, a p$^+$ layer 7, in a gate region, formed over the bottom and sidewall of a trench 8 formed in a substrate surface 1, a source electrode 10, and a drain electrode 9. The junction FET 1 acts to narrow a channel with a depletion layer extending from a junction surface formed between the p$^+$ layer 7 in the gate region and the n$^-$ layer 5 in the drift region.

The junction FET 1 has such characteristics that as illustrated in FIG. 3, when a voltage of about 1V is applied to the gate, an electric current starts flowing and when a voltage of 2.5V or greater is applied to the gate, a drain current tends to be saturated. In addition, since a diffusion potential of a pn junction between the gate and source is about 2.8V, application of a voltage of 2.5V or greater to the gate produces an electric current between the gate and source. In order to simplify the drive circuit of the gate as much as possible, it is preferred that no electric current passes through the gate. Desirably, the junction FET 1 is OFF at a gate voltage of 0V and is ON at a gate voltage of from about 1.5 to 2.5V. The junction FET 1 used in the present embodiment has an active size of 2 mm square and on resistance of about 3 mΩ.

Figure 4:
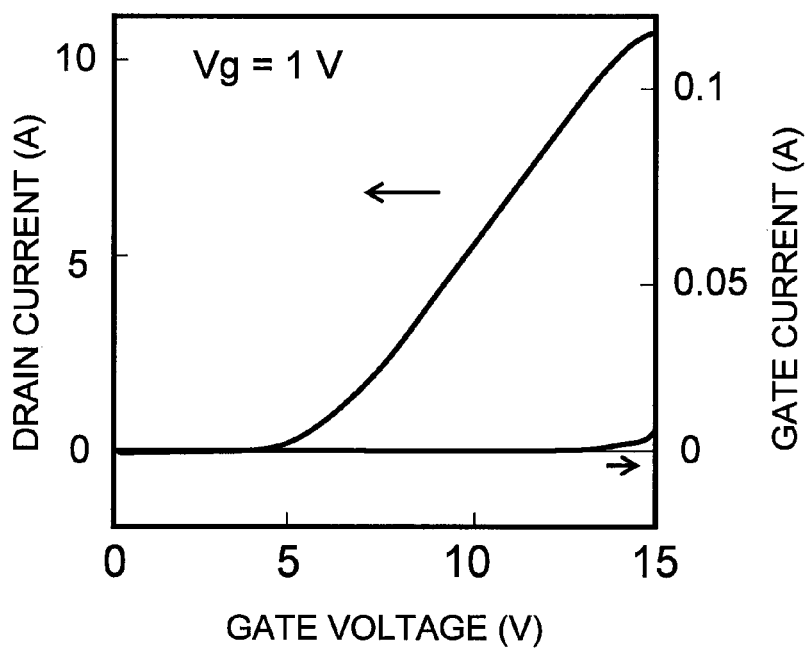
FIG. 4 is a characteristic diagram of the first embodiment of the semiconductor device according to the invention.

Advantages of the present embodiment will next be described. FIG. 4 shows the relationship between a voltage VG of an external gate terminal and a drain current of the junction FET 1. As shown in this graph, the voltage applied to the external gate terminal is shared by the capacitor 2 and the diode 3, and the gate of the junction FET 1. Application of a voltage of about 4V to the external gate terminal produces a drain current through the junction FET 1, while application of a voltage of even about 15V to the external gate terminal produces no gate current. This means that an apparent threshold voltage increases from 1V to about 4V and at the same time, the sensitivity of the drain current to the gate voltage decreases to about one fourth. This makes it possible to use a gate drive circuit similar to that for the conventional MOSFET.

Figure 5:
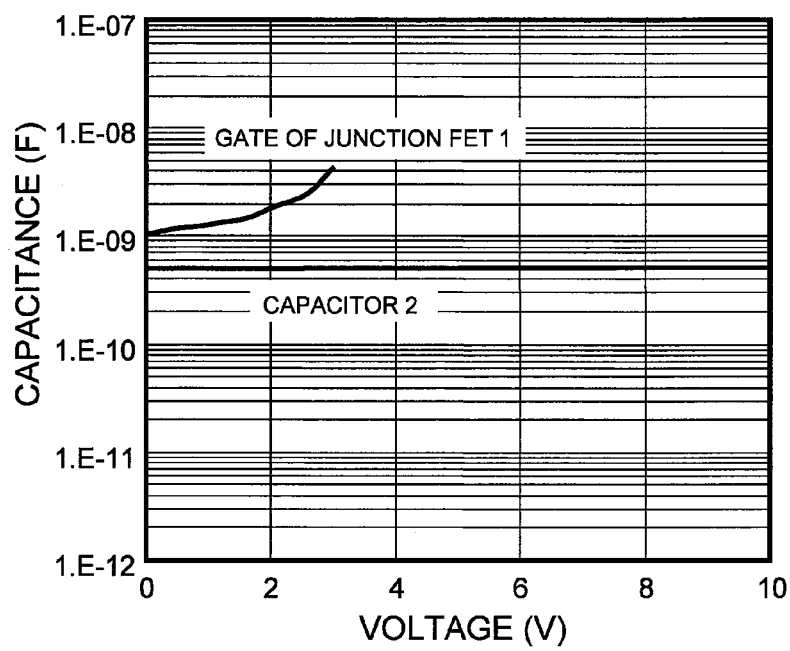
FIG. 5 is a capacitance characteristic diagram of the silicon carbide junction FET and a capacitor used in the first embodiment of the semiconductor device according to the invention.
Figure 6:
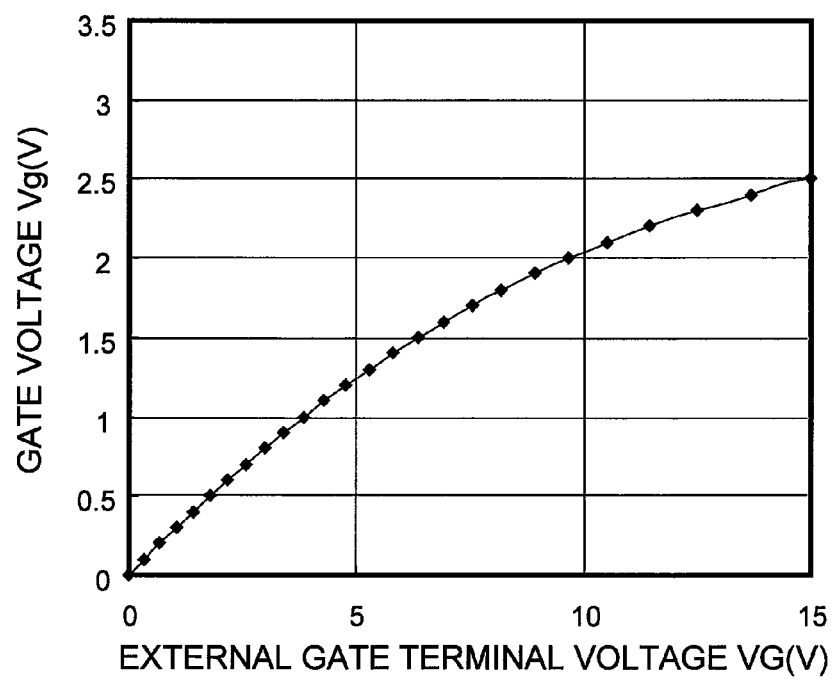
FIG. 6 is a view for describing voltage sharing in the first embodiment of the semiconductor device according to the invention.

A description will next be made of the manner how the voltage applied to the external gate terminal G (FIG. 1) is shared. Simply, the manner how the voltage applied to the terminal is shared is determined based on the synthesized capacitance of the capacitor 2 and the diode 3 and the gate capacitance of the junction FET 1. Supposing that charges provided for these two capacitances are equal, the voltage is shared so as to be proportionate to the reciprocal of the capacitance in accordance with the relation of Q=CV. FIG. 5 shows the voltage dependence of the synthesized capacitance of the capacitor 2 and the diode 3 and the gate capacitance of the junction FET 1, while FIG. 6 shows the relationship between the voltage VG of the external gate terminal and the gate voltage of the junction FET 1. As will be described later, the diode 3 is not required to be large because it may be a current path upon discharging of the gate. The capacitance of the capacitor 2 is greater than that of the diode 3 so that voltage dependence of the synthesized capacitance is small. On the other hand, the gate of the junction FET 1 is in a forward direction of the pn junction so that with an increase in the gate voltage, the depletion layer becomes narrow and the capacitance increases. According to this, the voltage VG of the external gate terminal and the gate voltage Vg of the junction FET 1 do not configure a complete linear relationship but the voltage can be shared by them well. With regard to the gradient of the drain current relative to each of the threshold voltage and the gate voltage, desired characteristics can be realized. In the present embodiment, the capacitor 2 having a capacitance of about 500 pF is used so as to give the gate voltage of the junction FET 1 of 2.5V when the voltage of the external gate terminal is 15V. This means that the gate capacitance is about 2500 pF when the junction FET 1 has a gate voltage of 2.5V so that in order to apply to the capacitor 2 a voltage of about five times as much as that of the junction FET 1, the capacitance of the capacitor 2 is set at 500 pF, one fifth of 2500 pF. In power devices, a power supply of from 10V to 20V tends to be used for applying a voltage to their gate. It is therefore preferred to set the voltage of the external gate terminal at from about 10V to 20V when a voltage of 2.5V is applied to the gate of the junction FET 1 and set the capacitance of the capacitor 2 at from about $\frac{1}{3}$ to $\frac{1}{7}$ of the gate capacitance at the time when the gate voltage is 2.5V.

Figure 7:
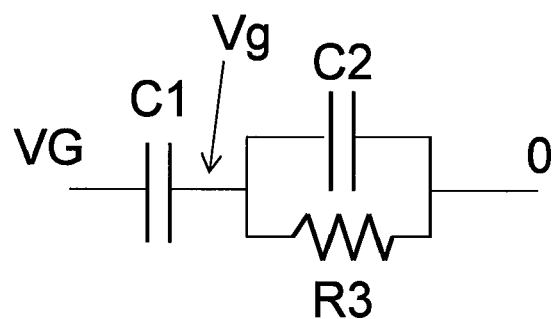
FIG. 7 is an equivalent circuit diagram of the first embodiment of the semiconductor device according to the invention.
Figure 8:
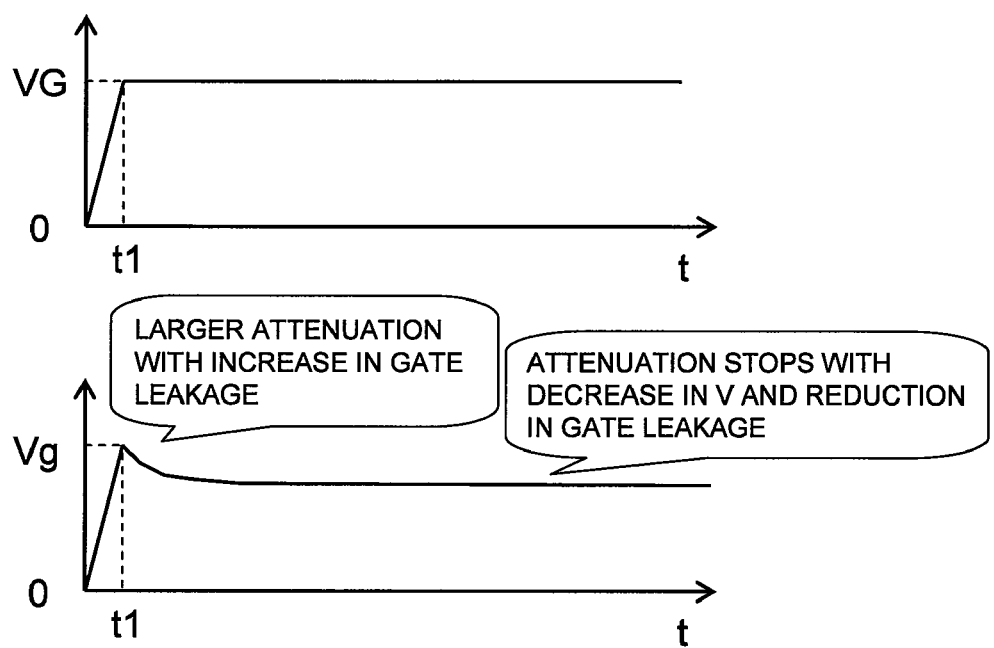
FIG. 8 illustrates the transient characteristic of the first embodiment of the semiconductor device according to the invention.

Next, a transitional behavior in the present embodiment will be described. In the above simplified description, capacitive components are coupled in series to each other. In practice, however, application of a voltage to the gate of the junction FET 1 produces a leakage current so that as illustrated in FIG. 7, an equivalent circuit having a component of a variable resistance added in parallel with the capacitive component of the gate of the junction FET 1 is formed. In this case, as shown in FIG. 8, when a voltage is applied to the external gate terminal, the gate voltage of the junction FET 1 responds to it and increases to the voltage (to the point of t1) determined by the capacitance ratio as described above. After that, however, due to a gate leakage current, charges accumulated in the capacitance partially leak and the gate voltage Vg of the junction FET 1 starts attenuation. A decrease in the gate voltage Vg leads to a decrease in the gate leakage current so that the gate voltage Vg becomes stable at a certain level. The attenuation amount is determined by the characteristic of the gate leakage current. On the contrary, one of the characteristics of the present embodiment is that a passage of the gate leakage current exceeding a certain level is stopped automatically so that the device is not deteriorated or a gate driver is not broken by an excessive gate current. When discharging of the gate is performed during turn off, charges can be transferred smoothly because of the diode 3 serving as a current path. When the device is used for soft switching system, the diode 3 is not essential and also in this case, an advantage similar to that described above can be achieved.

Figure 9:
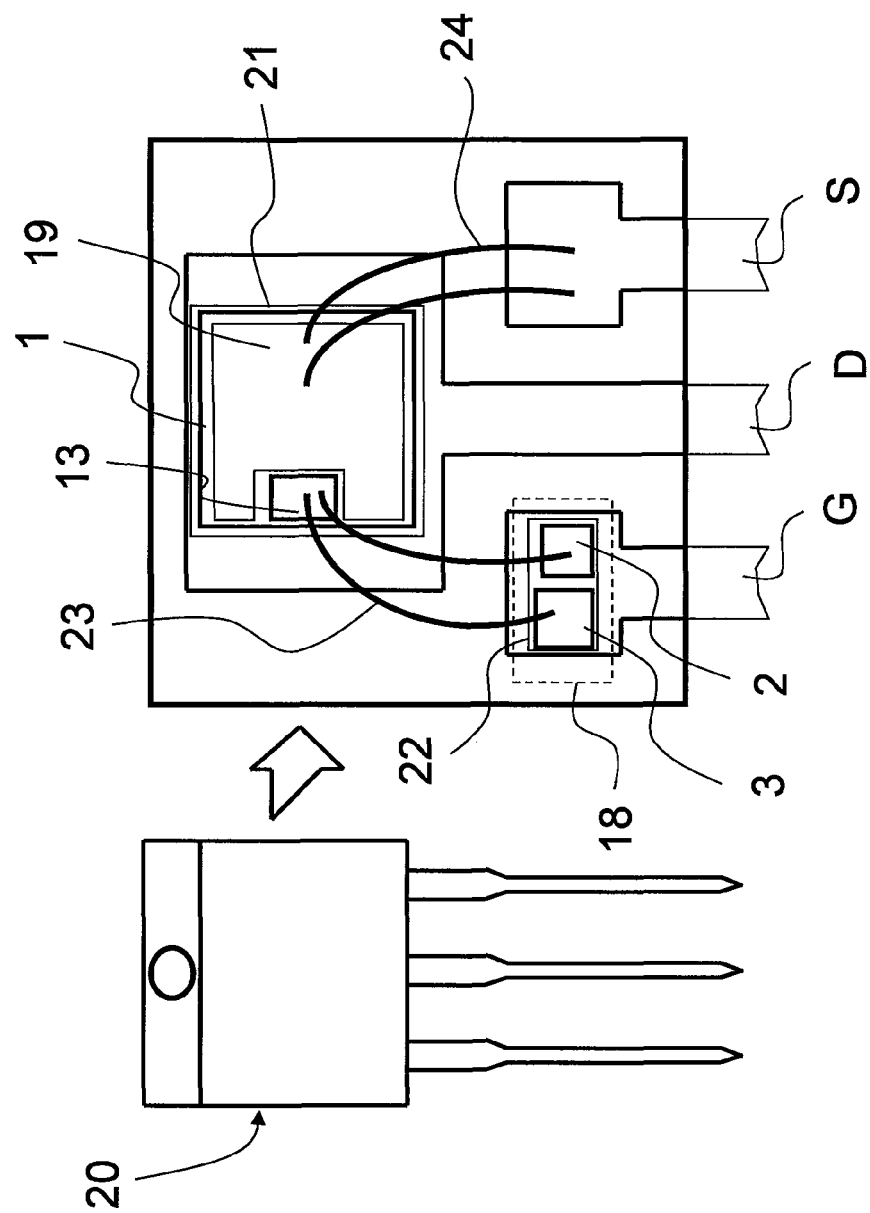
FIG. 9 illustrates the packaging in the first embodiment of the semiconductor device according to the invention.

The present embodiment will next be described. In this embodiment, as illustrated in FIG. 9, a package 20 having three pins has therein a junction FET 1, a capacitor 2, and a diode 3 (that is, an insertion element or an insertion element group 18). As the capacitor 2, an MIM capacitor formed over a silicon substrate is used, while as the diode 3, a silicon pn diode is used. A drain electrode 9 of the junction FET 1 is die bonded to a pin D (external drain terminal, that is, a first pin), which is at the center of the three pins, via a first solder layer 21; and the capacitor 2 and the diode 3 are die bonded to a pin G (an external gate terminal, that is, a second pin), which is the left-side pin of the three pins, via a second solder layer 22. A bonding wire 23 (first bonding wire) extends from a gate pad 13 of the junction FET 1 to one of electrodes of the capacitor 2 and an anode of the diode 3 to couple them to each other. A bonding wire 24 (second bonding wire) extends from a source pad 19 of the junction FET 1 to a pin S (external source terminal, that is, a third pin), which is the right-side pin of the three pins, to directly couple them to each other. Due to such packaging, this device has apparently a threshold voltage as high as about 4V and can operate at a gate voltage of about 15V. As a result, it can be driven similar to the conventional MOSFET.

Incidentally, in the present embodiment, a trench type junction FET is used. If it is a normally-off type, it is however not required to be a trench type and another structure such as a planar type has a similar advantage. In addition, the diode 2 is not required to be a silicon pn diode. It may be another diode such as silicon Schottky barrier diode, silicon carbide Schottky barrier diode, or gallium nitride Schottky barrier diode insofar as it has a reverse voltage of about 15V.

2. Description of a Semiconductor Device and the Like of a Second Embodiment According to the Present Application (Mainly from FIG. 10 to FIG. 13)

Figure 10:
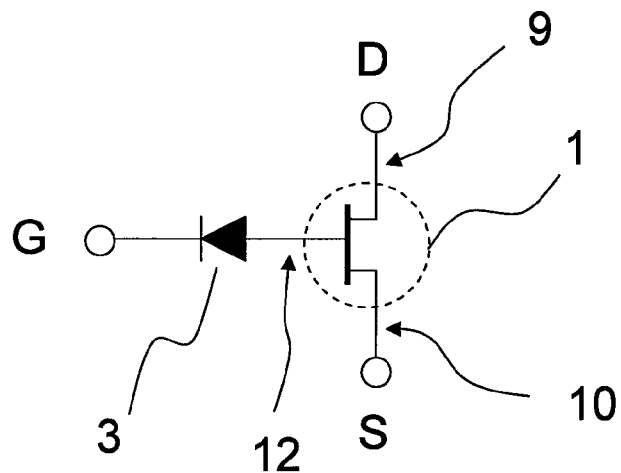
FIG. 10 is a circuit diagram of a second embodiment of a semiconductor device according to the invention.

FIG. 10 is a circuit diagram of the second embodiment of the invention. A difference from the first embodiment is that a diode 3 serves also as a capacitive component instead of the capacitor 2. Accordingly, the capacitance of the diode 3 becomes one digit greater than that of the first embodiment. A silicon carbide junction FET is similar to that of the first embodiment.

Figure 11:
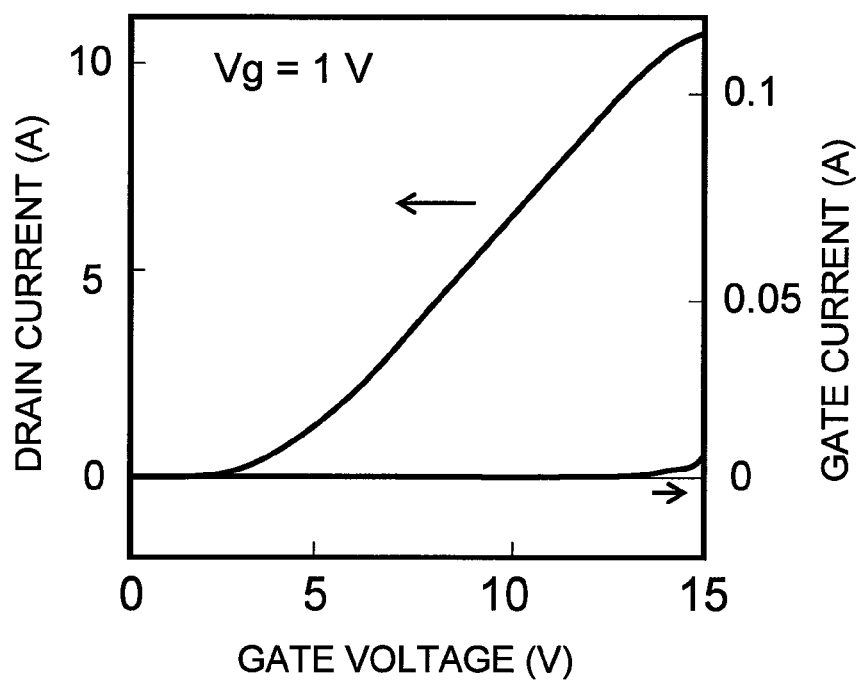
FIG. 11 is a characteristic diagram of the second embodiment of the semiconductor device according to the invention.

Advantages of the present embodiment will next be described. FIG. 11 shows the relationship between a voltage VG of an external gate terminal and a drain current of the junction FET 1. As shown in this graph, the voltage applied to the external gate terminal G is shared by the diode 3 and the gate of the junction FET 1. Application of a voltage of about 2V to the external gate terminal produces a drain current through the junction FET 1, while application of a voltage of even about 15V to the external gate terminal produces no gate current. This means that an apparent threshold voltage increases from 1V to about 2V and at the same time, the sensitivity of the drain current to the gate voltage decreases to about one fifth.

Figure 12:
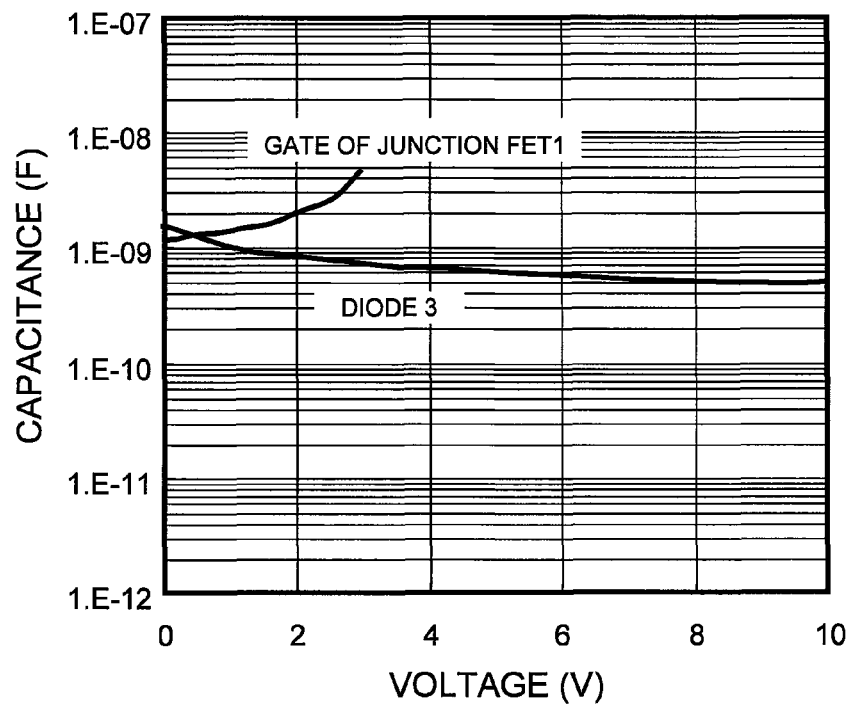
FIG. 12 is a capacitance characteristic diagram of a silicon carbide junction FET and a capacitor used in the second embodiment of the semiconductor device according to the invention.
Figure 13:
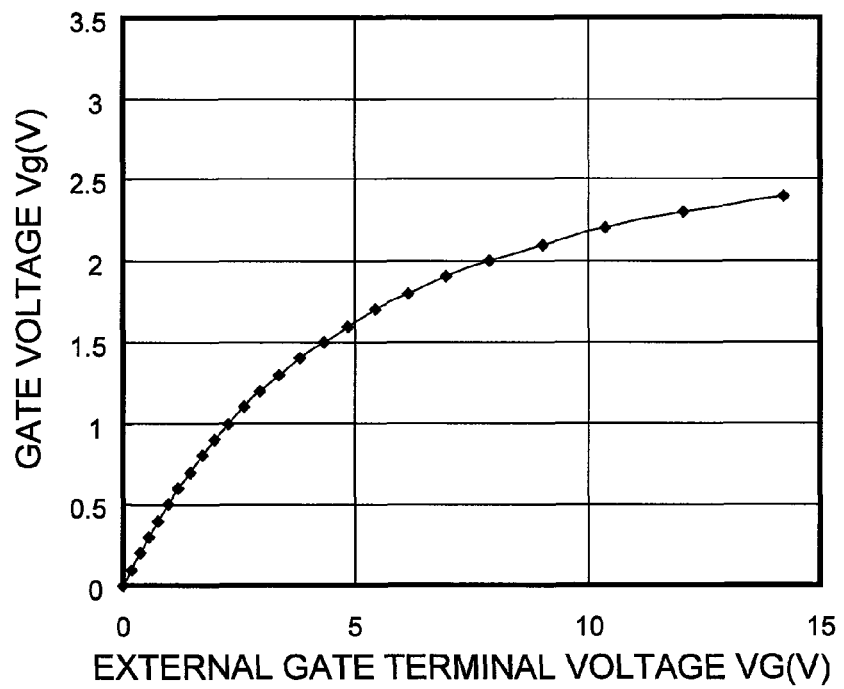
FIG. 13 is a view for describing voltage sharing in the second embodiment of the semiconductor device according to the invention.

The reason why the threshold voltage of the present embodiment is lower than that of the first embodiment will next be described referring to a capacitance-voltage characteristic of the diode 3 shown in FIG. 12 and a relationship between the voltage VG of the external gate terminal G and the gate voltage Vg of the junction FET 1 shown in FIG. 13. A difference in the capacitance characteristic between the capacitor 2 of the first embodiment and the diode 3 of the present embodiment is presence or absence of voltage dependence. The devices in both embodiments are each designed to give a gate voltage Vg of the junction FET 1 of 2.5V when the voltage VG of the external gate terminal is 15V so that a ratio of the capacitance at the time when the gate voltage of the junction FET 1 is 2.5V to a capacitance at the time when a voltage applied to the diode 3 is 12.5V is 5:1. When the voltage VG of the external gate terminal is small, the gate capacitance of the junction FET 1 exceeds the capacitance of the capacitor 2 in any voltage range and a large voltage is applied to the capacitor 2, making it possible to share the voltage desirably. In the present embodiment, on the other hand, when the voltage is small, the gate capacitance of the junction FET 1 becomes smaller than the capacitance of the diode 3. When the voltage VG applied to the external gate terminal is small, a voltage applied to the gate (gate 12) of the junction FET 1 becomes large, making it difficult to share the voltage desirably. As a result, the threshold voltage is smaller than that in the first embodiment.

In the present embodiment, a reverse diode whose capacitance decreases with an increase in the voltage is used, while in the first embodiment, a capacitor whose capacitance does not depend on a voltage is used. Using a forward diode whose capacitance increases with an increase in the voltage does not bring about a sufficient advantage, because the forward diode has an extremely increased capacitance as it approaches a diffusion potential, making it impossible for the forward diode to share a voltage exceeding the diffusion potential.

As described above, the manner how to share a voltage varies, depending on a difference in capacitance characteristics, but the other behaviors are similar to those of the first embodiment. In addition, a package of this embodiment has three pins, similar to the package of the first embodiment, and is similar to the first embodiment except that the capacitor 2 of the first embodiment is omitted from the device of the present embodiment.

In the present embodiment, if the junction FET is a normally-off type, it is not required to be a trench type and the other structures including a planar type have a similar advantage. In addition, the diode 3 is not required to be a silicon pn diode. It may be another diode such as silicon Schottky barrier diode, silicon carbide Schottky barrier diode, or gallium nitride Schottky barrier diode insofar as it has a reverse voltage of about 15V.

3. Description of a Semiconductor Device and the Like of a Third Embodiment of the Present Application (Mainly from FIG. 14 to FIG. 21)

A difference of the third embodiment from the first embodiment and the second embodiment is that the semiconductor device of the present embodiment includes, in a chip thereof, a capacitor 2 and a diode 3. Prior to describing the present embodiment, the configuration of a conventional chip and the structure of a gate pad will be described referring to FIGS. 14 and 15 (an A-A' cross-section of a peripheral region of a gate pad illustrated in FIG. 14). In the conventional junction FET 1, a gate pad 13 and a source pad 19 are placed over the surface of the chip and the source pad 19 has an active region 28 of the device right below the source pad 19. An interconnect 12 of the gate is placed over an on-substrate insulating film 11 and is coupled to the gate pad 13. A passivation film 14 is formed to cover therewith the gate pad 13.

Figure 14:
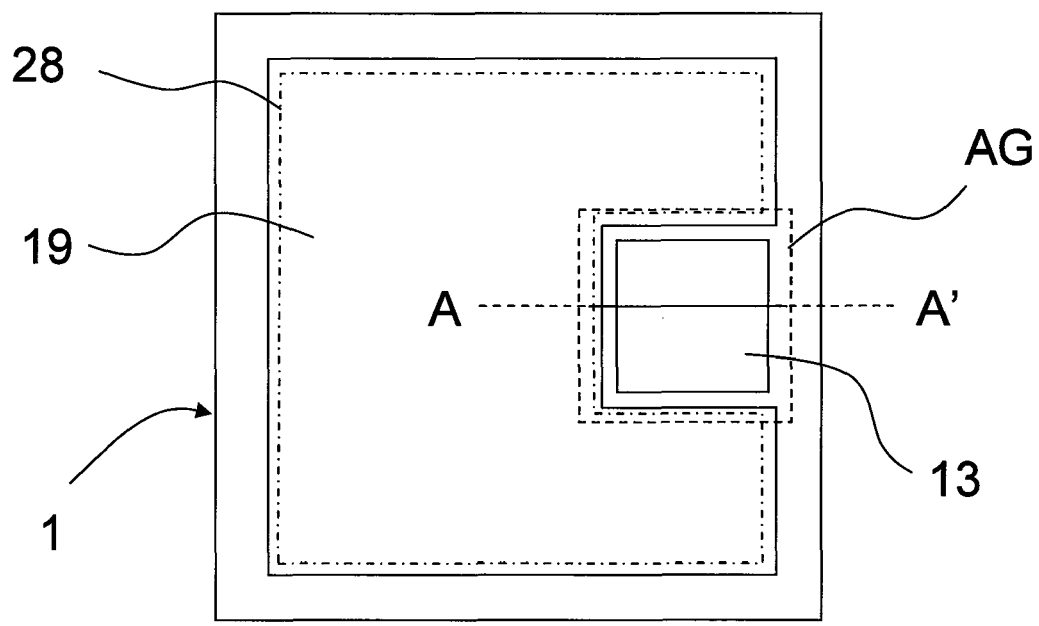
FIG. 14 is a plan view of a chip in a third embodiment of the semiconductor device according to the invention.
Figure 15:
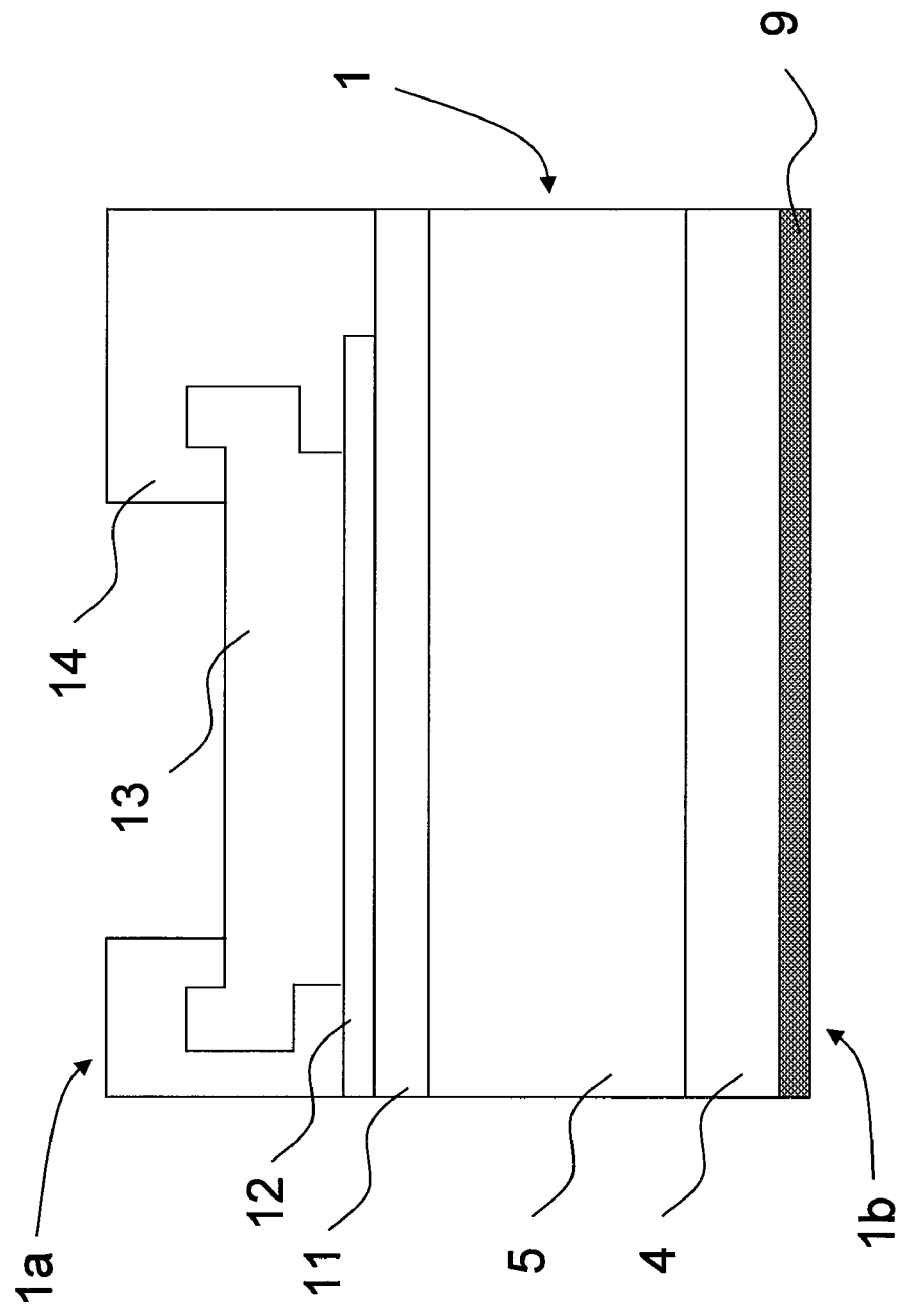
FIG. 15 is a cross-sectional structural view below a gate pad of a junction FET having a conventional structure.
Figure 16:
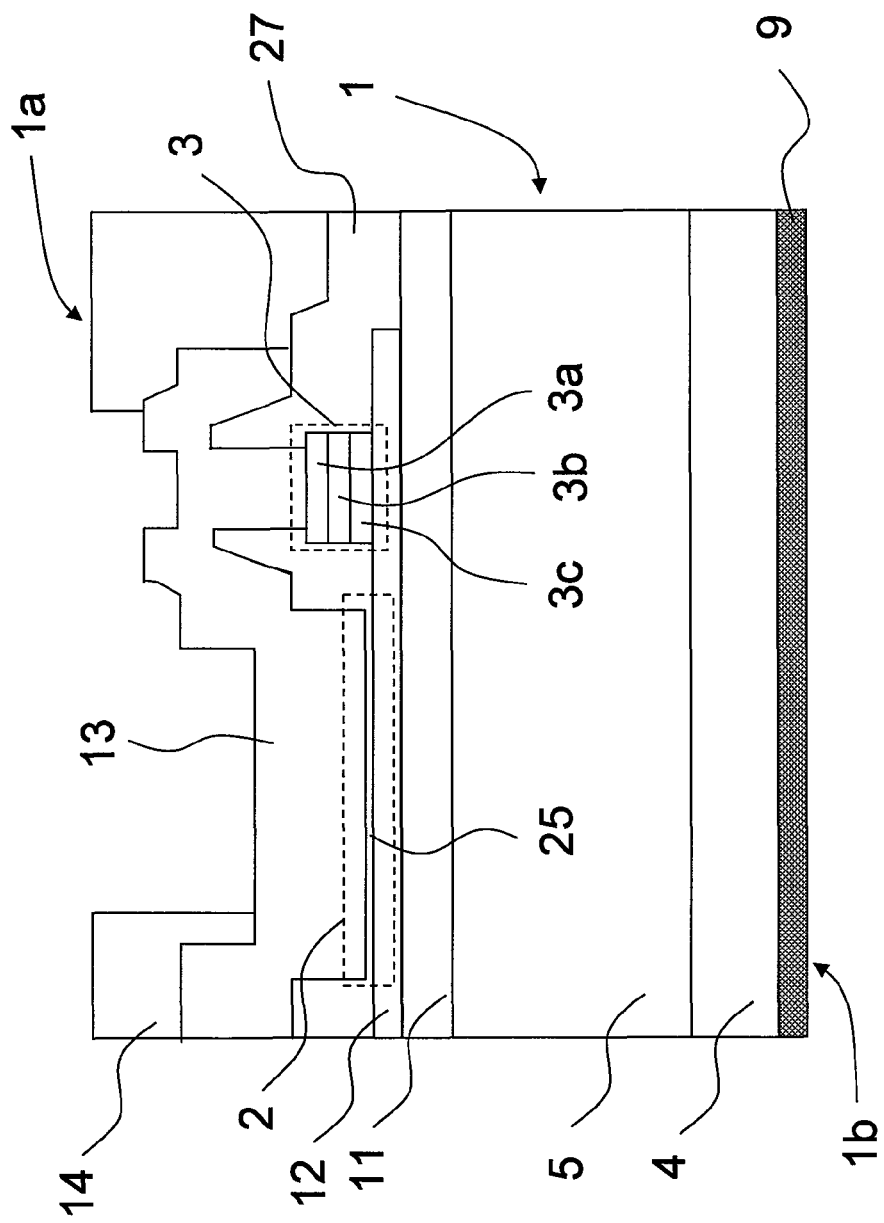
FIG. 16 is a cross-sectional structural view of a third embodiment of the semiconductor device according to the invention.

In the present embodiment, on the other hand, a gate pad 13 has therebelow a capacitor 2 and a diode 3 as illustrated in FIG. 16 (an A-A' cross-section of a peripheral region AG of a gate pad illustrated in FIG. 14). As the capacitor 2, an MIM capacitor, which has a capacitor insulating film 25 sandwiched between metals, is employed. Tungsten is used as a lower-side metal 12 (gate electrode), while aluminum is used as an upper-side metal (gate pad 13) and each of them has a TiN thin film on the interface with the capacitor insulating film 25 (and an interlayer insulating film 27). An $SiO_2$ film is used as the capacitor insulating film 25 and it has a film thickness of 18 nm to achieve a desired capacitance. The desired capacitance is, as described in the first embodiment, 500 pF. The diode 3 is made of polysilicon and obtained by stacking p+, n−, and n+ one after another successively in a direction opposite to the gate (meaning that a P+ region 3$c$ of the diode, an N− region 3$b$ of the diode, and an N+ region 3$a$ of the diode). Further, the interlayer insulating film 27 and the gate pad 13 have thereover a final passivation film 14.

The behavior in the present embodiment is similar to that in the first embodiment. In addition, a single chip body is shown in the present embodiment, but it may be mounted in a package as shown in the first embodiment.

A manufacturing method in the present embodiment will next be described referring to FIGS. 17 to 21. Only a region AG of the gate pad is illustrated in these drawings. The active region 28 may have any form insofar as it is a normally-off type junction FET. In the present embodiment, a trench type junction FET as illustrated in FIG. 2 is employed.

Figure 17:
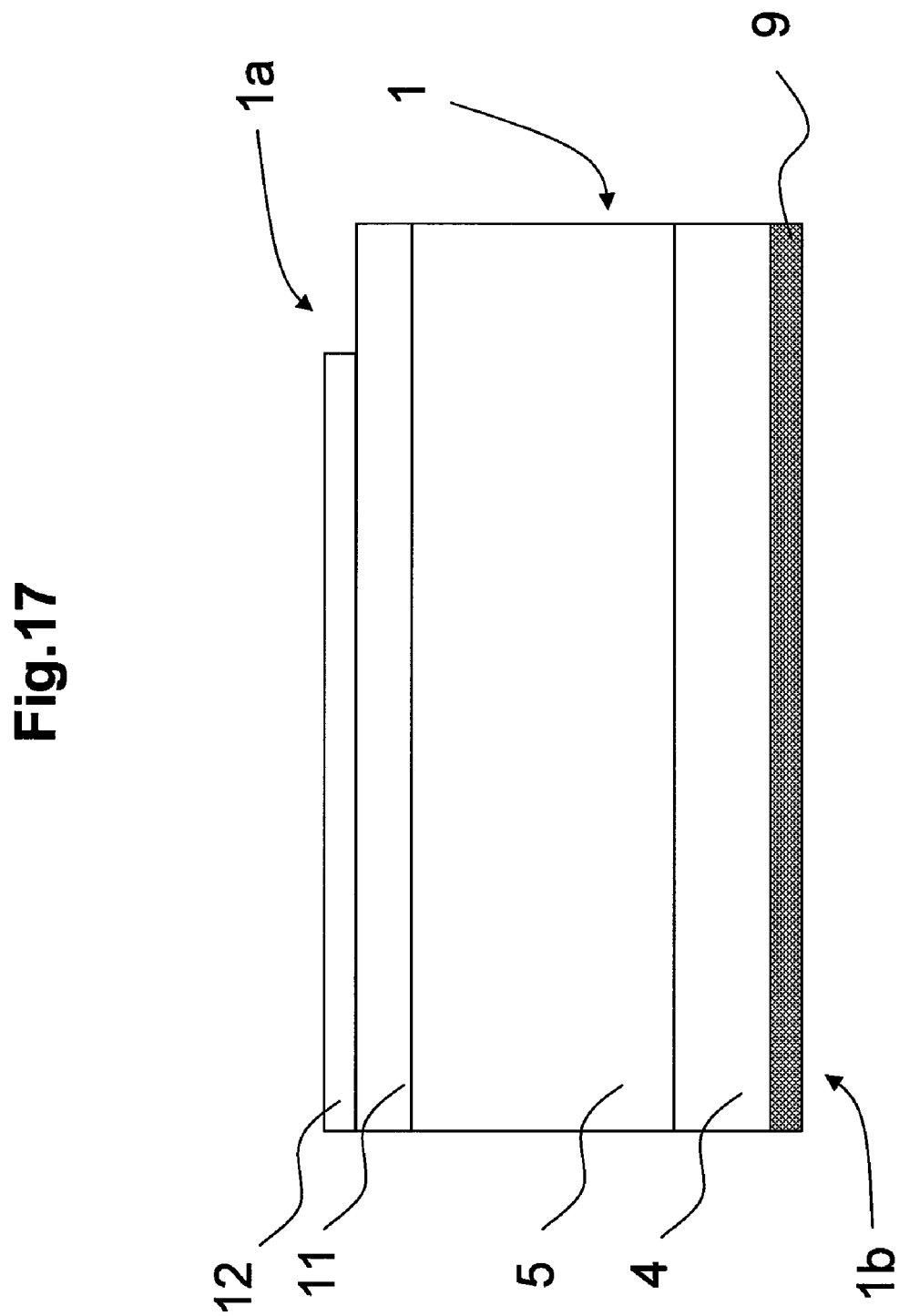
FIG. 17 illustrates a manufacturing method relating to the third embodiment of the semiconductor device according to the invention.

As illustrated in FIG. 17, after formation of the active region 28, 300-nm tungsten and 15-nm TiN film, which will be a gate wiring 12, are deposited successively by sputtering over an on-substrate insulating film 11. Patterning using lithography and dry etching is then performed to obtain the gate wiring 12 (gate electrode).

Figure 18:
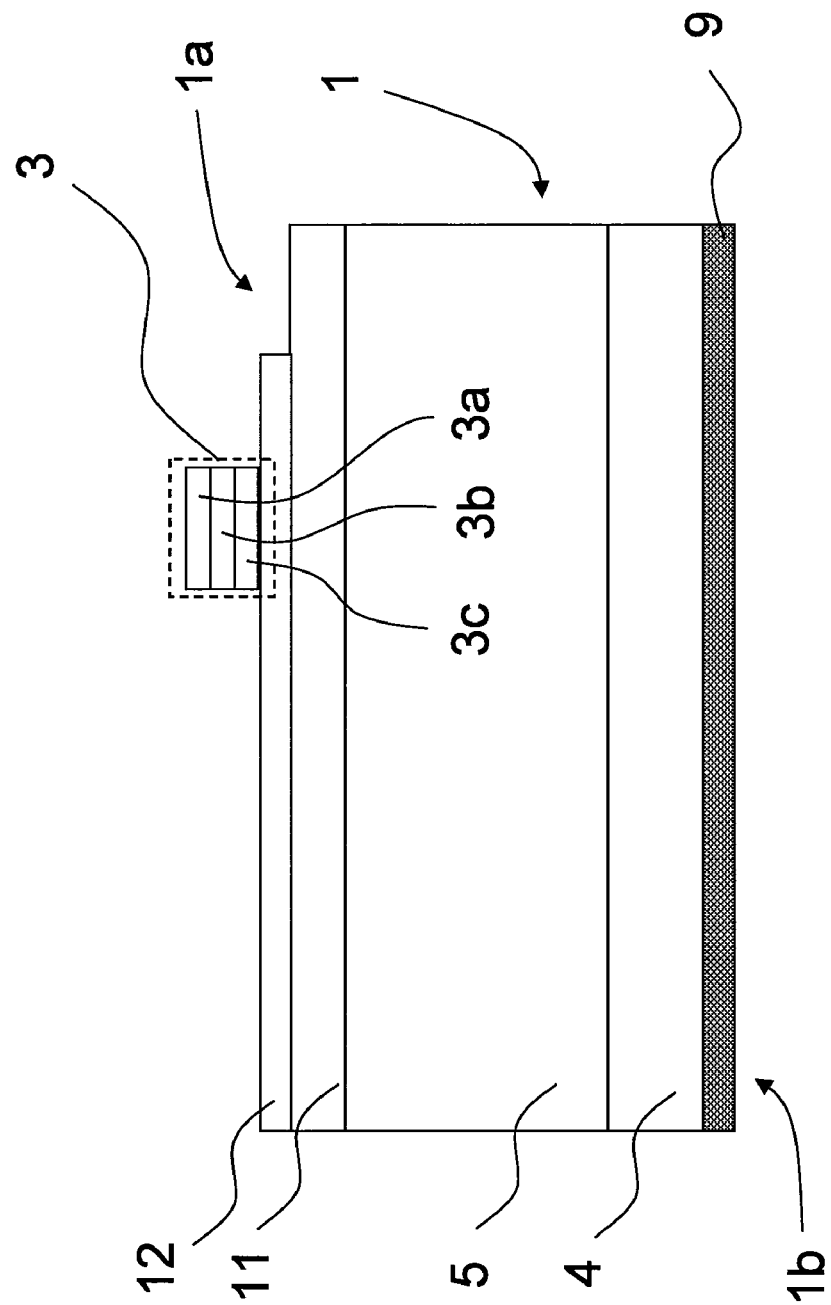
FIG. 18 illustrates the manufacturing method relating to the third embodiment of the semiconductor device according to the invention.

As illustrated in FIG. 18, a diode 3 is then formed by using polysilicon. This diode formation process comprises stacking of a phosphorus-doped p+ polysilicon (P+ region 3$c$ of the diode), a boron-doped n-polysilicon (an N− region 3$b$ of the diode), and a boron-doped n+ (N+ region 3$a$ of the diode) polysilicon one after another. They are then patterned by using lithography and dry etching.

Figure 19:
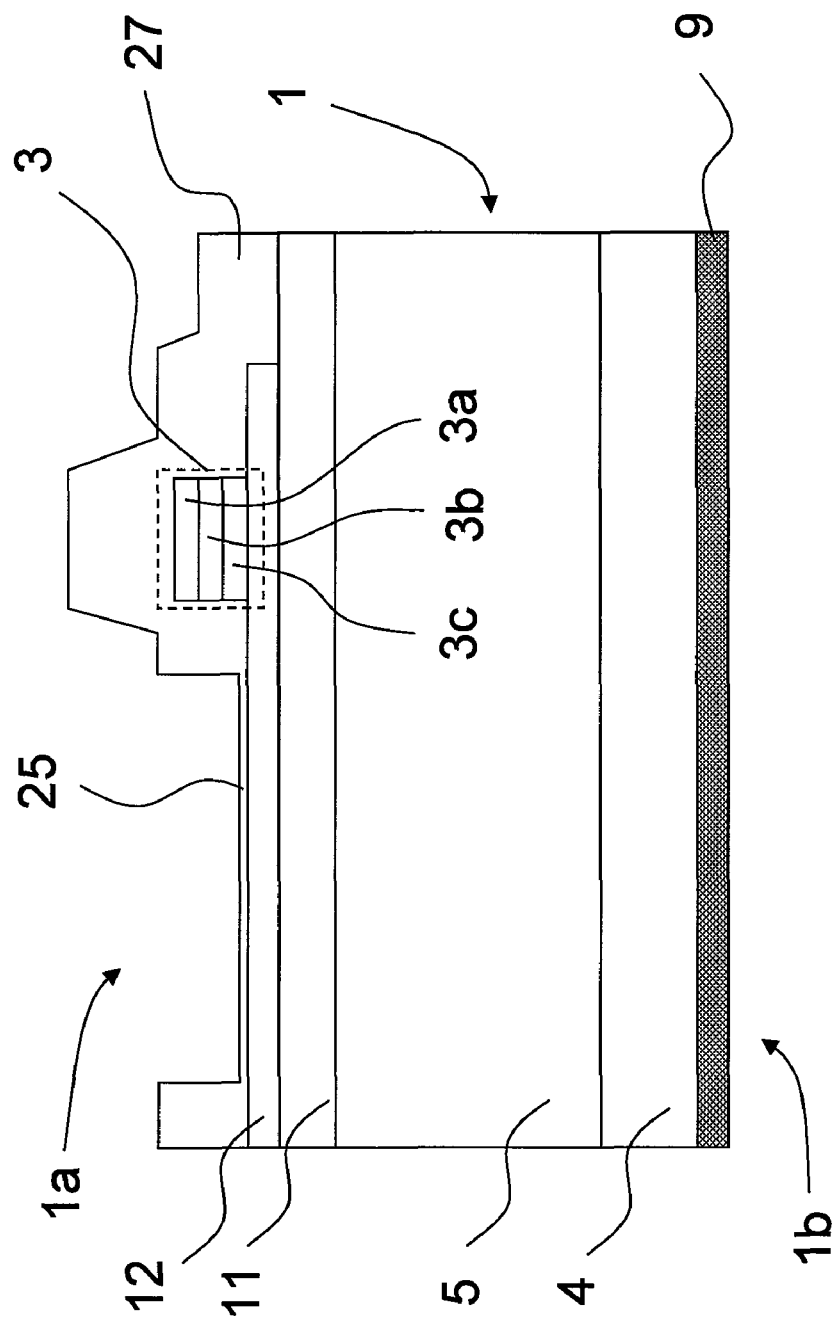
FIG. 19 illustrates the manufacturing method relating to the third embodiment of the semiconductor device according to the invention.

As illustrated in FIG. 19, an MIM capacitor is then formed. This capacitor formation process comprises depositing an interlayer film 27 made of $SiO_2$ over the entire surface and carrying out lithography and dry etching to open a portion to be a capacitor. As an insulating film 25 of the capacitor, 18-nm $SiO_2$ is then deposited. It is formed by CVD with $SiH_4$ and $N_2O$ at a film formation temperature of 750° C.

Figure 20:
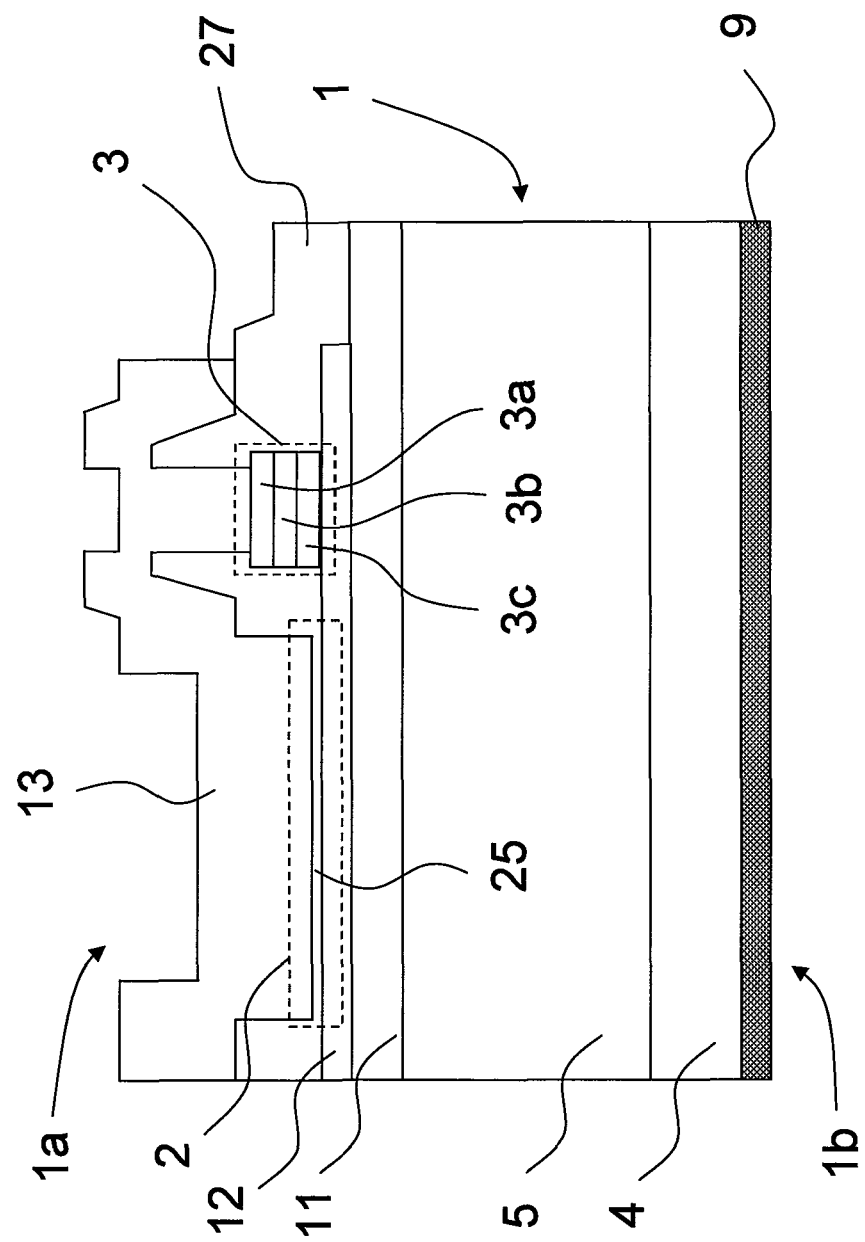
FIG. 20 illustrates the manufacturing method relating to the third embodiment of the semiconductor device according to the invention.

As illustrated in FIG. 20, a metal which will be a gate pad 13 is then formed. The metal film is a stack of 15-nm TiN and 3000-nm aluminum. The metal film which will be a gate pad 13 is then patterned by using lithography and wet etching.

Figure 21:
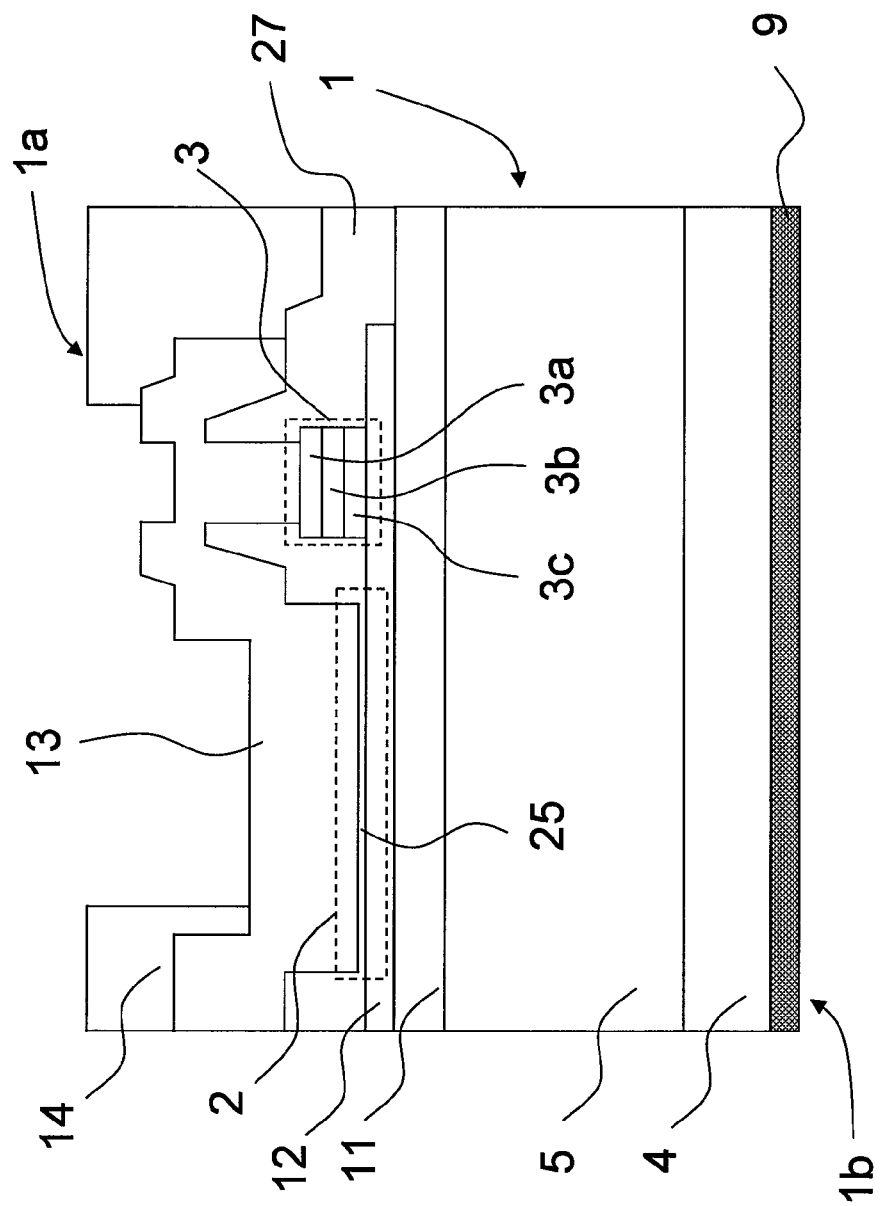
FIG. 21 illustrates the manufacturing method relating to the third embodiment of the semiconductor device according to the invention.

Finally, as illustrated in FIG. 21, $SiO_2$ which will be a passivation film 14 is deposited to give a thickness of 2000 nm. A pad portion is opened in this passivation film by using lithography and wet etching to complete this process. In the present embodiment, $SiO_2$ is used for the insulating film 25 of the capacitor 2, but a high-dielectric-constant insulating film made of, for example, an oxide or oxynitride of Al, Hf, or Ti may be used instead. In addition, the metal used for the wiring is merely an example and another metal may also be used.

4. Description of a Semiconductor Device of a Fourth Embodiment of the Present Application (Mainly, FIG. 22)

Figure 22:
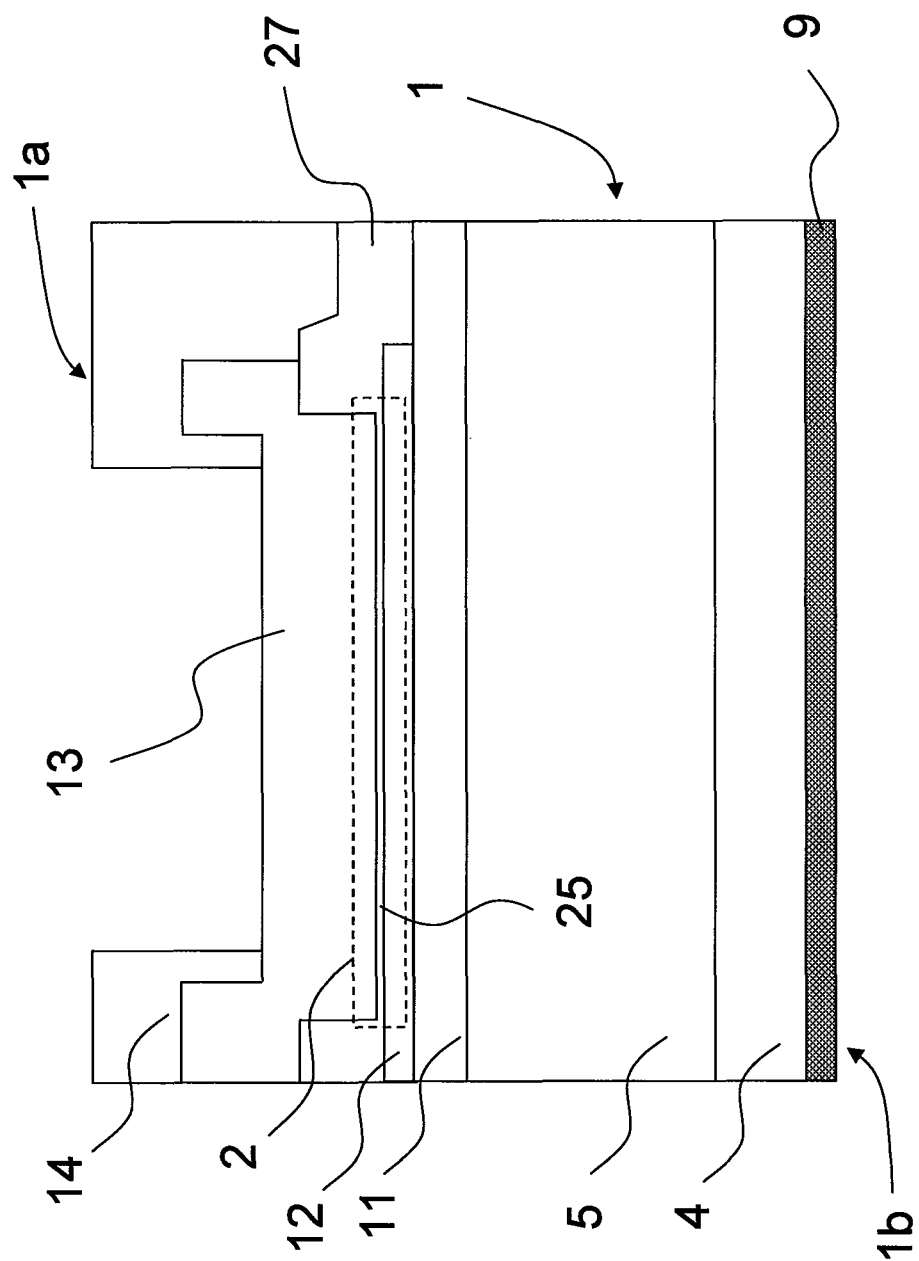
FIG. 22 is a cross-sectional structural view of a fourth embodiment of the semiconductor device according to the invention.

FIG. 22 is a cross-sectional structural view of the fourth embodiment of the invention. A difference of the present embodiment from the third embodiment is that only a capacitor 2 is formed in a region AG of a gate pad. A manufacturing method of this embodiment is similar to that of the third embodiment except for the exclusion of the formation of a polysilicon film which will be a diode 2, patterning of the polysilicon film, and formation of an opening over the polysilicon film. The manufacturing method in this embodiment is simpler than that of the third embodiment.

The behavior of the device in the present embodiment is similar to that in the first embodiment having no diode 3 and it can be used only in applications where discharging time of the gate upon switching is not limited.

5. Description of a Semiconductor Device and the Like of a Fifth Embodiment of the Present Application (Mainly FIG. 23)

Figure 23:
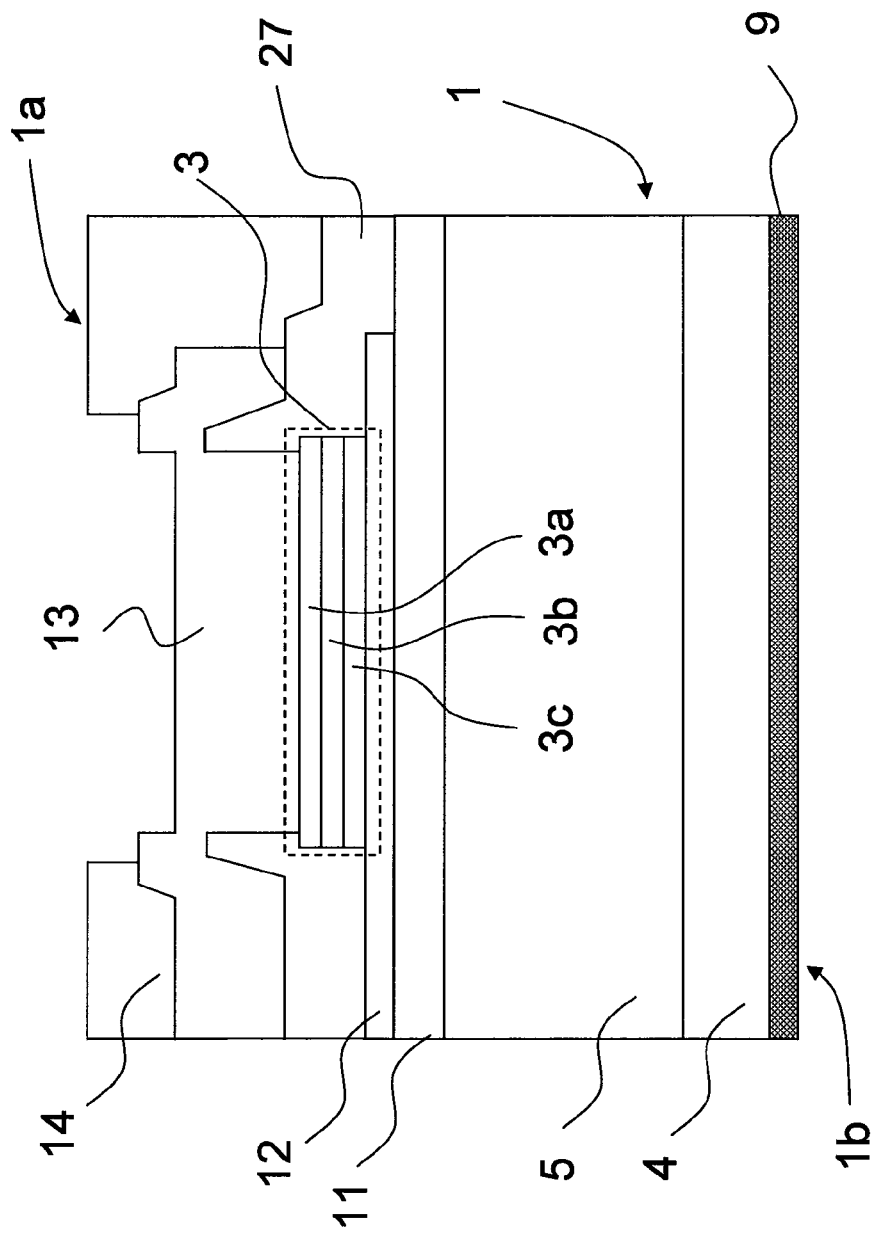
FIG. 23 is a cross-sectional structural view of a fifth embodiment of the semiconductor device according to the invention.

FIG. 23 is a cross-sectional structural view of the fifth embodiment of the present invention. This embodiment is similar to the second embodiment except that the diode 3 is incorporated in a chip 1 of the device. A manufacturing method of this device is similar to that of the third embodiment except for the exclusion of opening of a capacitor portion and formation of an insulating film 25 of the capacitor 2. The capacitance characteristic of the diode 3 is similar to that of the second embodiment and it is designed to have a capacitance of 500 pF when a voltage of 12.5V is applied to the diode 3. The behavior of the device is also similar to that of the second embodiment.

6. Description of a Semiconductor Device and the Like of a Sixth Embodiment of the Present Application (Mainly, FIG. 24)

Figure 24:
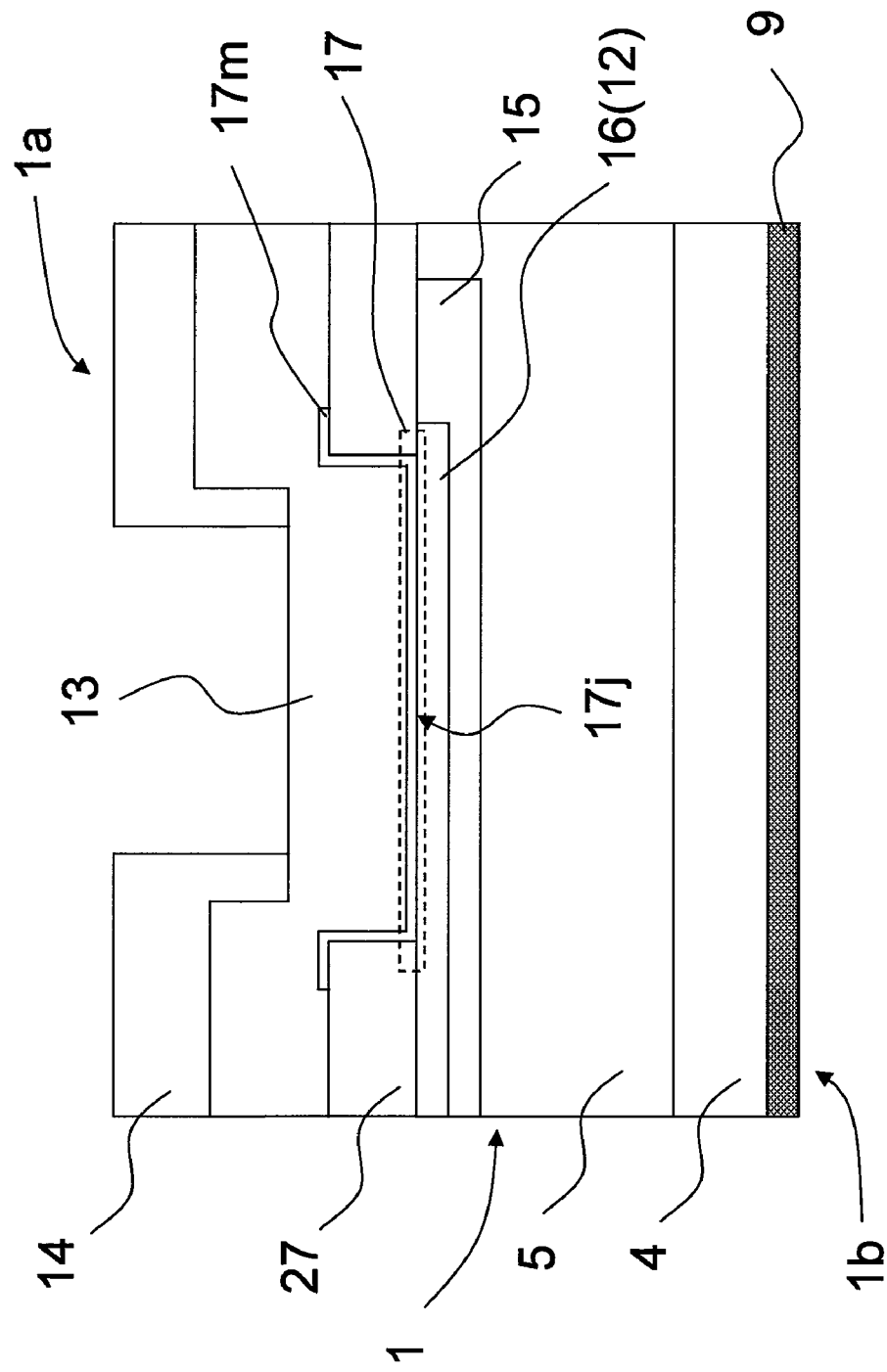
FIG. 24 is a cross-sectional structural view of a sixth embodiment of the semiconductor device according to the invention.

FIG. 24 is a cross-sectional structural view of the sixth embodiment of the invention. The device of the present embodiment is similar to that of the fifth embodiment except that the diode 3 is a Schottky barrier diode 17 using a silicon carbide substrate 1. Although omitted from the drawings of the first to fifth embodiments, a termination p region 15 lies below a gate pad and it has thereon a p+ region 16 (this serves as a gate electrode 12) to have a contact with the gate. In the present embodiment, Ti is formed over the p+ region 16 as a Schottky metal 17$m$. Another metal such as Ni or Mo is usable as the Schottky metal 17$m$, but it is necessary to satisfy the characteristic described in the second embodiment as the capacitance characteristic of this Schottky barrier diode 17. The behavior of the present embodiment is similar to that of the second embodiment.

With regard to the termination region 15, ion species used in ion implantation is aluminum and the implantation concentration is, for example, about $1 \times 10^{17}$ cm$^{-3}$. The termination region 15 should be deeper than the gate region 7 so that multistage implantation with energy of 2 MeV is necessary upon ion implantation.

7. Description of the Semiconductor Device and the Like of the First Embodiment of the Present Application (Mainly, FIGS. 25 and 26)

Figure 28:
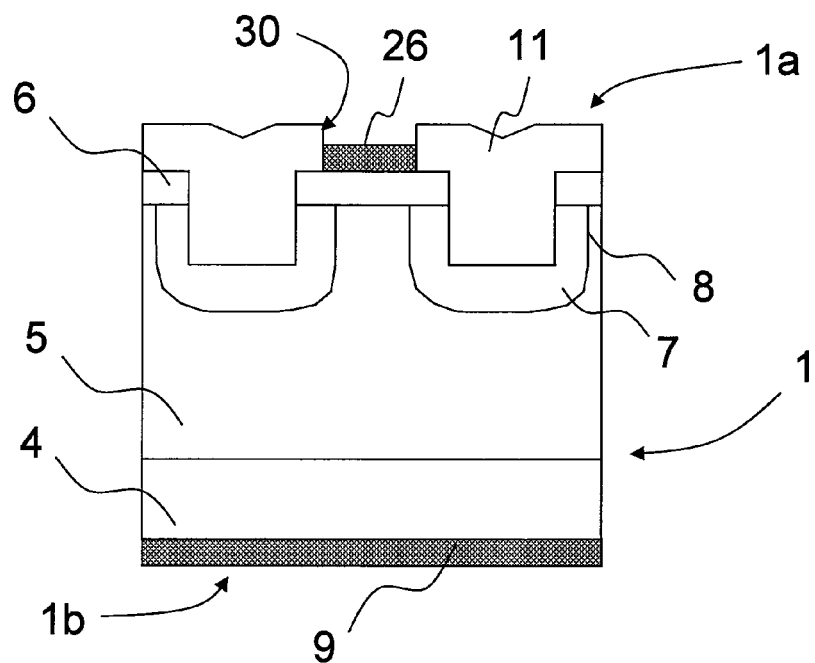
FIG. 28 is a device cross-section process flow diagram showing the outline of a manufacturing step of the semiconductor device of the first embodiment according to the present application (a step of siliciding the surface)
Figure 29:
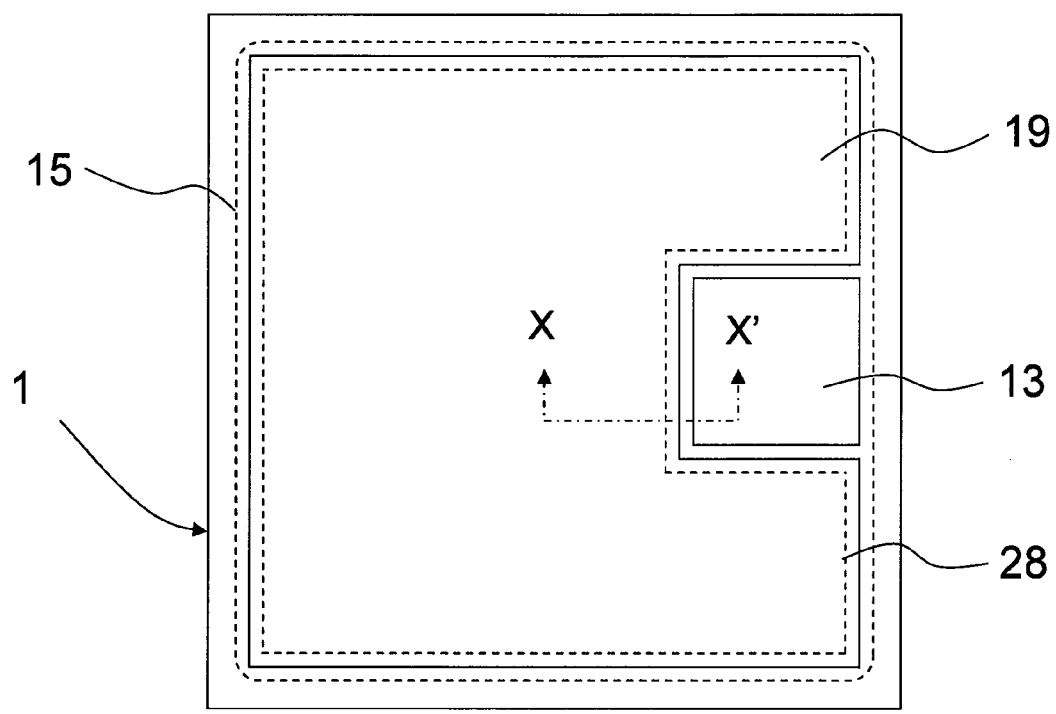
FIG. 29 is an upper plan view of a semiconductor chip of the first embodiment and the like according to the present application.

FIG. 29 is a top plan view of a chip of the silicon carbide-based junction FET (1) according to the first embodiment of the present application. As illustrated in FIG. 29, a source pad 19 and a gate pad 13 with which most of the chip area is occupied are provided over the chip 1. An active region 28 is provided in a region almost similar to that of the source pad 19 and in the vicinity of the periphery of these regions, a p type termination region 15 (not illustrated in the drawings other than FIG. 25 to ensure the simplicity). A cross-section taken along a line X-X' of FIG. 29 is shown in FIG. 30. An active cell cutout portion AC of FIG. 30 corresponds to FIG. 2 and FIGS. 25 to 28, while a gate pad peripheral region AG corresponds to FIGS. 15 to 24.

As illustrated in FIG. 30, a nickel silicide film (over which a junction metal such as gold, a barrier metal, and the like for packaging have been stacked in actual products) which will be a drain electrode 9 is provided on the surface of an N+ type drain region 4 on the side of a backside surface 1$b$ of an SiC single crystal semiconductor substrate 1. A surface region of an N− type drift region 5 on the side of a surface 1$a$ of the SiC single crystal semiconductor substrate 1 have therein linear trenches 8 serving as a principal portion of the junction FET. Each of the trenches 8 has, on an inner surface thereof, a P+ type gate region 7 and in a surface region between the P+ type gate regions 7, an N+ type source region 6 is provided. The lead-out of the P+ type gate region 7 is carried out by a P+ type gate contact region 16 provided in the surface region thereof serves. The trenches 8 are each filled with an on-substrate insulating film 11 and the N+ type source region 6 is coupled to a source electrode 10 (which is an M1 interconnect layer and is made of, for example, a refractory metal such as tungsten) via a silicide layer 26 (nickel silicide film) formed in a source contact hole formed in this on-substrate insulating film 11. On the other hand, the P+ type gate contact region 16 is coupled to a gate electrode 12 (which is a gate interconnect and at the same time, is an M1 interconnect layer and is made of, for example a refractory metal such as tungsten) similarly via the silicide layer 26. The source electrode 10 and the gate electrode 12 have thereover an interlayer insulating film 27 and the interlayer insulating film 27, the source electrode 10, and the gate electrode 12 have thereover a source pad 19 (which is an M2 interconnect layer and is made of, for example, an aluminum-based metal film) coupled to the source electrode 10 and a gate pad 13 (which is an M2 interconnect layer and is made of, for example, an aluminum-based metal film) coupled to the gate electrode 12. Furthermore, the interlayer insulating film 27, the source pad 19, and the gate pad 13 have thereover a final passivation film 14.

The junction FET in this example is designed to have a breakdown voltage of about 600V. In FIG. 30, therefore, the epitaxial layer 5 (drift layer) has an impurity concentration of $2 \times 10^{16}$ cm$^{-3}$ and a thickness of 6 μm and the trench 8 has a depth of 1.2 μm and a width of 1 μm. The source region 6 has a range of from about 0.8 μm to 1.0 μm in width because the width of it has a direct influence on the device characteristics (particularly, threshold voltage). The gate region 7 is a p type semiconductor region using, for example, aluminum as an impurity and it has a peak concentration of about $10^{19}$ cm$^{-3}$.

8. Description of a Manufacturing Method of the Semiconductor Device and the Like of the First Embodiment According to the Present Application (Mainly from FIGS. 27 to 30)

This section provides the outline of a manufacturing method (wafer process) of the active cell region cutout portion AC (corresponding to FIG. 2) of the semiconductor device (electronic circuit device) 1 described in the section 7.

Figure 25:
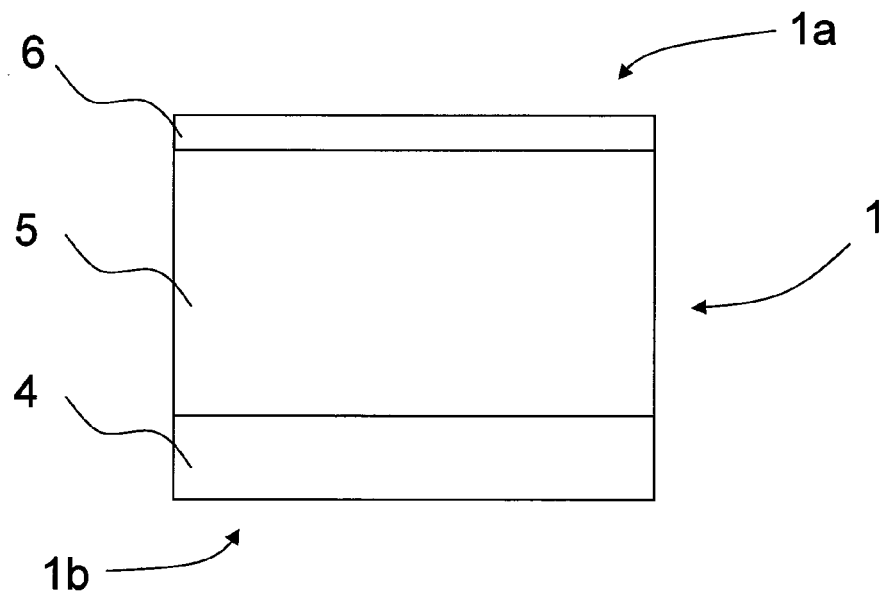
FIG. 25 is a device cross-section process flow diagram showing the outline of a manufacturing step of the semiconductor device of the first embodiment according to the present application (from a first step to a step of introducing an N+ source region)

As illustrated in FIG. 25, an epitaxial wafer 1 having an N− type epitaxial layer 5 formed on the side of the surface 1$a$ of an N+ type single crystal SiC wafer 4 (plane direction of the surface is, for example, a C plane direction) is prepared. For example, ion implantation (with nitrogen as ion species at a wafer temperature of, for example, about 500° C.) is then performed to form an N+ type source region 6 on the side of the surface 1$a$ of the epitaxial wafer 1.

Figure 26:
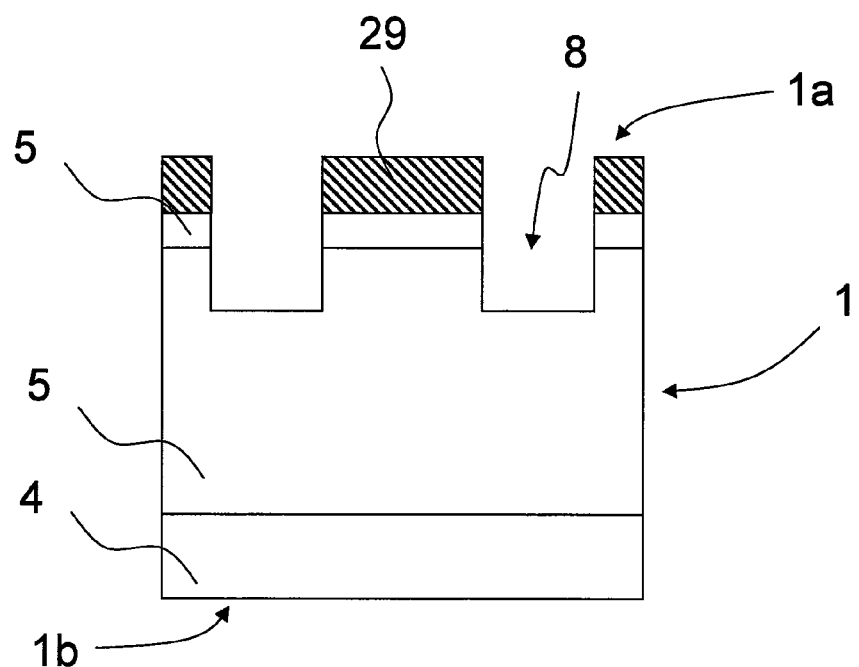
FIG. 26 is a device cross-section process flow diagram showing the outline of a manufacturing step of the semiconductor device of the first embodiment according to the present application (a step of forming a trench)

Then, as illustrated in FIG. 26, a silicon oxide film which will be a hard mask 29 is then formed almost all over the surface on the side of the surface 1$a$ of the epitaxial wafer 1 by using, for example, CVD (chemical vapor deposition). A resist film 29 is then applied almost all over the surface on this hard mask 29. Then, ordinary lithography is performed to pattern the resist film 29 and with the resulting patterned resist film 29 as a mask, the silicon oxide film 29 is etched to pattern the hard mask film 29. With the resulting hard mask film 29, the SiC substrate is anisotropically dry etched to form many linear trenches 8 penetrating through the N+ type source region 6.

Figure 27:
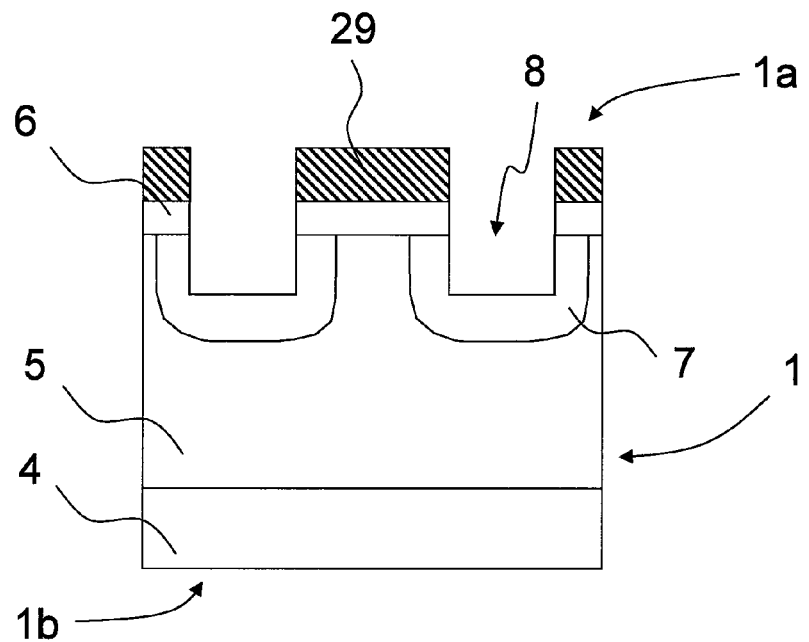
FIG. 27 is a device cross-section process flow diagram showing the outline of a manufacturing step of the semiconductor device of the first embodiment according to the present application (a step of forming a P+ gate region)

As illustrated in FIG. 27, a P+ type gate region 7 is formed by carrying out ion implantation (with an implantation energy of, for example, from about 100 to 150 keV at a wafer temperature of about 500° C.) from perpendicular direction and a plurality of oblique directions (for example at an angle of about 25 degree from the perpendicular direction) while using the hard mask film 29. Then, activation annealing is conducted at a temperature of, for example, about 1600° C. Then, the hard mask film 29 which becomes unnecessary is removed.

As illustrated in FIG. 28, a silicon oxide film is formed as the on-substrate insulating film 11 almost all over the surface on the side of the surface 1$a$ of the wafer 1 by using, for example, CVD to fill therewith the trenches 8. Then, a resist film 29 is applied almost all over the surface on the side of the surface 1$a$ of the wafer 1. Ordinary lithography is then performed to pattern the resist film 29 and with the resulting patterned resist film 29 as a mask, the silicon oxide film 11 is anisotropically dry etched to open a source contact hole 30. After deposition of a nickel film (Ni film) over the insulating film 11 including the inside of the source contact hole 30, heat treatment (annealing) is performed at about 1000° C. to form a source electrode 10 made of a nickel silicide film 26. Then, an unreacted nickel film is removed. Similarly on the side of the backside surface 1$b$ of the semiconductor substrate 1, after formation of a nickel film on the backside surface 1$b$ of the semiconductor substrate 1, heat treat is performed at about 1000° C. to form a drain electrode 9 made of a nickel silicide film (composed mainly of Ni$_2$Si).

Then, as illustrated in FIG. 30, tungsten interconnects 10 and 12 (replaced by an aluminum-based interconnect when a polysilicon member is not formed as an upper layer as illustrated in FIG. 16) to be coupled to the nickel silicide film 26 are formed on the side of the surface 1$a$ of the semiconductor substrate 1. Then, an interlayer insulating film 27 made of a silicon oxide film is formed over the surface 1$a$ of the semiconductor substrate 1, followed by formation of aluminum-based interconnects 13 and 19 between the resulting interlayer insulating films 27. A final passivation film 14 is then formed over the resulting aluminum-based interconnects 13 and 19 and then opening portions are formed therein as a source pad 19 and a gate pad 14.

9. Summary

The invention made by the present inventors has been described specifically with reference to some embodiments. The present invention is not limited to them and needless to say, it can be changed without departing from the scope of the invention.

For example, in the above embodiments, examples using a silicon oxide-based film as an insulating film have been described specifically. The present invention is however not limited to them and it is needless to say that a silicon nitride-based film or organic resin film may be used instead.

What is claimed is:

1. An electronic circuit device comprising:
   (a) a silicon carbide-based normally-off type junction FET having a gate electrode, a source electrode, and a drain electrode; and
   (b) an element or an element group inserted between the gate electrode of the normally-off type junction FET and a gate drive circuit,
   wherein the element or the element group, in which elements have been coupled in parallel to each other, includes a capacitor and a diode whose anode is coupled to the gate electrode and whose cathode is coupled to the gate drive circuit, but does not include other parallel-coupled elements, and
   wherein when a voltage applied to the element or the element group is 12.5 V, a capacitance of the element or the element group is from $1/3$ to $1/7$ of a gate capacitance at the time when a gate voltage of the junction FET is 2.5 V.

2. An electronic circuit device comprising:
   (a) a silicon carbide-based normally-off type junction FET having a gate electron, a source electrode, and a drain electrode;
   (b) an element or an element group inserted between the gate electrode of the normally-off type junction FET and a gate drive circuit;
   (c) a package comprising the junction FET and the capacitor or the diode housed therein and comprising first, second, and third pins;
   (d) a first solder layer configuring a current path between the first pin and the drain electrode of the junction FET;
   (e) a second solder layer configuring a current path between the second pin and a cathode electrode of the diode or one of electrodes of the capacitor;
   (f) a first bonding wire configuring a current path between the gate electrode of the junction FET and an anode electrode of the diode or the other electrode of the capacitor; and
   (g) a second bonding wire configuring a current path between the third pin and the source electrode of the junction FET,
   wherein the element or the element group, in which elements have been coupled in parallel to each other, includes a capacitor and/or a diode whose anode is coupled to the gate electrode and whose cathode is coupled to the gate drive circuit, but does not include other parallel-coupled elements.

3. An electronic circuit device comprising:
   (a) a silicon carbide-based normally-off type junction FET having a gate electrode, a source electrode, and a drain electrode;
   (b) an element or an element group inserted between the gate electrode of the normally-off type junction FET and a gate drive circuit;
   (c) a package comprising the junction FET, the capacitor, and the diode housed therein and comprising first, second and third pins;
   (d) a first solder layer configuring a current path between the first pin and the drain electrode of the junction FET;
   (e) a second solder layer configuring a current path among the second pin, a cathode electrode of the diode, and one of electrodes of the capacitor;
   (f) a first bonding wire configuring a current path among the gate electrode of the junction FET, an anode electrode of the diode, and the other electrode of the capacitor; and
   (g) a second bonding wire configuring a current path between the third pin and the source electrode of the junction FET,
   wherein the element or the element group, in which elements have been coupled in parallel to each other, includes a capacitor and a diode whose anode is coupled to the gate electrode and whose cathode is coupled to the gate drive circuit, but does not include other parallel-coupled elements.

4. The electronic circuit device according to claim 2, wherein when a voltage applied to the element or the element group is 12.5 V, a capacitance of the element or the element group is from $1/3$ to $1/7$ of a gate capacitance at the time when a gate voltage of the junction FET is 2.5 V.

* * * * *